(12) United States Patent
Liu et al.

(10) Patent No.: US 11,282,909 B2
(45) Date of Patent: Mar. 22, 2022

(54) DISPLAY PANEL AND MANUFACTURING METHOD THEREOF, DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tingliang Liu, Beijing (CN); Haigang Qing, Beijing (CN); Huijuan Yang, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 101 days.

(21) Appl. No.: 16/642,093

(22) PCT Filed: Jul. 31, 2019

(86) PCT No.: PCT/CN2019/098704
§ 371 (c)(1),
(2) Date: Feb. 26, 2020

(87) PCT Pub. No.: WO2020/155593
PCT Pub. Date: Aug. 6, 2020

(65) Prior Publication Data
US 2021/0193766 A1  Jun. 24, 2021

(30) Foreign Application Priority Data
Jan. 29, 2019 (CN) .......................... 201910085404.8

(51) Int. Cl.
*H01L 27/32* (2006.01)
*H01L 51/52* (2006.01)
(Continued)

(52) U.S. Cl.
CPC ........ *H01L 27/3262* (2013.01); *H01L 27/326* (2013.01); *H01L 27/3218* (2013.01);
(Continued)

(58) Field of Classification Search
CPC ............. H01L 27/3218; H01L 27/3216; H01L 27/3262; H01L 51/5209
See application file for complete search history.

(56) References Cited

U.S. PATENT DOCUMENTS 8,947,414 B2  2/2015 Noguchi
10,084,150 B1 * 9/2018 Lou ........................ H01L 51/56
(Continued)

FOREIGN PATENT DOCUMENTS

CN  102473367 A   5/2012
CN  207781608 U * 8/2018 ............. H01L 27/32
(Continued)

OTHER PUBLICATIONS

Machine translation, Liu, Chinese Pat. Pub. No. CN 207781608U, translation date: Jul. 30, 2021, Espacenet, all pages. (Year: 2021).*
(Continued)

*Primary Examiner* — Victoria K. Hall
(74) *Attorney, Agent, or Firm* — Dilworth & Barrese, LLP.; Michael J. Musella, Esq.

(57) ABSTRACT

A display panel and a manufacturing method thereof, and a display device are provided. The display panel includes a base substrate and a plurality of sub-pixels disposed on the base substrate, the plurality of sub-pixels constitute a plurality of repeating units, and each of the plurality of repeating units includes a sub-pixel of first color, two sub-pixels of second color, and a sub-pixel of third color, each of the plurality of sub-pixels includes a driving transistor, and the light emitting element includes a first electrode layer, a light emitting layer, and a second electrode layer; an orthographic
(Continued)

projection of the first electrode layer of the light emitting element in each sub-pixel of second color on the base substrate at least partially overlaps with an orthographic projection of a gate electrode of the driving transistor in each sub-pixel of second color on the base substrate.

19 Claims, 11 Drawing Sheets

(51) Int. Cl.
  *H01L 51/56* (2006.01)
  *H01L 27/12* (2006.01)
(52) U.S. Cl.
  CPC .......... *H01L 51/5209* (2013.01); *H01L 51/56* (2013.01); *H01L 27/1214* (2013.01)

(56) References Cited

U.S. PATENT DOCUMENTS

| | | | |
|---|---|---|---|
| 10,453,905 B2 | 10/2019 | An et al. | |
| 2009/0315814 A1* | 12/2009 | Tomida | H01L 27/3218 345/76 |
| 2012/0120045 A1* | 5/2012 | Noguchi | G09G 3/3233 345/211 |
| 2014/0292622 A1* | 10/2014 | Lee | H01L 27/3262 345/80 |
| 2014/0299843 A1* | 10/2014 | Kim | H01L 27/3262 257/40 |
| 2015/0170563 A1* | 6/2015 | Bang | H01L 27/3262 257/40 |
| 2015/0379924 A1* | 12/2015 | Matsueda | H01L 27/3218 345/690 |
| 2016/0163247 A1* | 6/2016 | Lee | H01L 27/3216 345/77 |
| 2016/0260792 A1* | 9/2016 | Kim | H01L 27/3276 |
| 2016/0321994 A1* | 11/2016 | Lee | G09G 3/2003 |
| 2016/0329391 A1* | 11/2016 | Ko | H01L 27/3216 |
| 2017/0011685 A1* | 1/2017 | Jeon | H01L 27/3272 |
| 2017/0012094 A1* | 1/2017 | Lee | H01L 27/3216 |
| 2017/0194403 A1* | 7/2017 | Jung | H01L 27/3248 |
| 2017/0294493 A1* | 10/2017 | Yoo | H01L 27/3218 |
| 2018/0006273 A1* | 1/2018 | Kim | H01L 51/5268 |
| 2018/0102400 A1* | 4/2018 | Choi | H01L 27/32 |
| 2018/0342570 A1* | 11/2018 | Hong | H01L 27/326 |
| 2018/0350886 A1* | 12/2018 | An | H01L 27/3262 |
| 2019/0074329 A1* | 3/2019 | Kim | H01L 27/3216 |
| 2019/0088200 A1* | 3/2019 | Woo | H01L 51/56 |
| 2019/0131371 A1* | 5/2019 | Yi | H01L 51/5284 |
| 2019/0189720 A1* | 6/2019 | Lim | H01L 27/3265 |
| 2019/0189722 A1* | 6/2019 | Lim | H01L 51/0097 |
| 2019/0189723 A1* | 6/2019 | Kim | H01L 27/1218 |
| 2019/0189732 A1* | 6/2019 | Rieutort-Louis | H01L 27/3218 |
| 2019/0196630 A1* | 6/2019 | Lai | G06F 3/0443 |
| 2020/0005709 A1* | 1/2020 | Kim | H01L 27/3262 |
| 2020/0075698 A1* | 3/2020 | Yang | H01L 27/3258 |
| 2020/0161399 A1* | 5/2020 | Park | H01L 27/3262 |
| 2021/0020689 A1* | 1/2021 | Okabe | H01L 33/005 |
| 2021/0319754 A1* | 10/2021 | Shang | H01L 27/3218 |
| 2021/0320156 A1* | 10/2021 | Shang | G09G 3/2003 |
| 2021/0328163 A1* | 10/2021 | Huang | H01L 51/0048 |
| 2021/0336071 A1* | 10/2021 | Huang | H01L 27/14629 |

FOREIGN PATENT DOCUMENTS

| | | | | |
|---|---|---|---|---|
| CN | 207781608 U | | 8/2018 | |
| CN | 108986739 A | | 12/2018 | |
| CN | 109166886 A | * | 1/2019 | ......... H01L 27/2379 |
| CN | 109166886 A | | 1/2019 | |
| EP | 3355356 A2 | * | 8/2018 | ......... H01L 51/5206 |

OTHER PUBLICATIONS

Machine translation, Wang, Chinese Pat. Pub. No. CN 109166886A, translation date: Jul. 30, 2021, Espacenet, all pages. (Year: 2021).*

* cited by examiner

DISPLAY PANEL AND MANUFACTURING METHOD THEREOF, DISPLAY DEVICE

CROSS-REFERENCE TO RELATED APPLICATION

The present application is a national stage application of International Patent Application No. PCT/CN2019//098704, filed on Jul. 31, 2019, which claims priority of Chinese Patent Application No. 201910085404.8, filed on Jan. 29, 2019, the disclosure of which is incorporated herein by reference in its entirety as part of the present application.

TECHNICAL FIELD

The embodiments of the present disclosure relate to a display panel and a manufacturing method thereof, and a display device.

BACKGROUND

An active matrix organic light emitting diode (AMOLED) is a current-type light emitting device that can emit light autonomously. Because the AMOLED has the characteristics of fast response speed, high refresh frequency, and low power consumption, the AMOLED is increasingly used in high-performance display panels.

The AMOLED display panel includes a base substrate and a plurality of sub-pixels arranged in an array on the base substrate. Each sub-pixel includes a driving transistor and a light emitting element connected to the driving transistor, and a drain electrode of the driving transistor may be connected to an anode of the light emitting element, and the driving transistor is used for driving the light emitting element to emit light. However, there is a difference in the luminous brightness among respective sub-pixels in the display panel, resulting in poor brightness uniformity of the display panel.

SUMMARY

At least some embodiments of the present disclosure provide a display panel, the display panel comprises: a base substrate and a plurality of sub-pixels disposed on the base substrate, the plurality of sub-pixels constitute a plurality of repeating units, each of the plurality of repeating units comprises a sub-pixel of first color, two sub-pixels of second color, and a sub-pixel of third color; each of the plurality of sub-pixels comprises a driving transistor and a light emitting element electrically connected to the driving transistor, and the light emitting element comprises a first electrode layer, a light emitting layer, and a second electrode layer; an orthographic projection of the first electrode layer of the light emitting element in each sub-pixel of second color on the base substrate at least partially overlaps with an orthographic projection of a gate electrode of the driving transistor in each sub-pixel of second color on the base substrate.

For example, in the display panel provided by some embodiments of the present disclosure, the orthographic projection of the gate electrode of the driving transistor in each sub-pixel of second color on the base substrate is within the orthographic projection of the first electrode layer of the light emitting element in each sub-pixel of second color on the base substrate.

For example, in the display panel provided by some embodiments of the present disclosure, each of the plurality of sub-pixels comprises a pixel circuit, and the pixel circuit comprises the driving transistor, the orthographic projection of the first electrode layer of the light emitting element in a first one of the two sub-pixels of second color on the base substrate at least partially overlaps with an orthographic projection of the pixel circuit in a second one of the two sub-pixels of second color on the base substrate; the orthographic projection of the first electrode layer of the light emitting element in the second sub-pixel of second color on the base substrate does not overlap with the orthographic projection of the pixel circuit in the first sub-pixel of second color on the base substrate.

For example, in the display panel provided by some embodiments of the present disclosure, a shape of the first electrode layer of the light emitting element in the first sub-pixel of second color is different from a shape of the first electrode layer of the light emitting element in the second sub-pixel of second color.

For example, in the display panel provided by some embodiments of the present disclosure, the first electrode layer of the light emitting element in the first sub-pixel of second color comprises: a first driving electrode block and an auxiliary electrode block connected to the first driving electrode block; an orthographic projection of the first driving electrode block on the base substrate does not overlap with the orthographic projection of the gate electrode of the driving transistor in the first sub-pixel of second color on the base substrate; and an orthographic projection of the auxiliary electrode block on the base substrate at least partially overlaps with the orthographic projection of the gate electrode of the driving transistor in the first sub-pixel of second color on the base substrate.

For example, in the display panel provided by some embodiments of the present disclosure, a ratio of an area of a first projection overlap region of the auxiliary electrode block to an area of a second projection overlap region of the first electrode layer of the light emitting element in the second sub-pixel of second color is within a ratio range; the first projection overlap region is an overlap region between the orthographic projection of the auxiliary electrode block on the base substrate and the orthographic projection of the gate electrode of the driving transistor in the first sub-pixel of second color on the base substrate, the second projection overlap region is an overlap region between the orthographic projection of the first electrode layer of the light emitting element in the second sub-pixel of second color on the base substrate and the orthographic projection of the gate electrode of the driving transistor in the second sub-pixel of second color on the base substrate, and the ratio range is from 90 percent to 110 percent.

For example, in the display panel provided by some embodiments of the present disclosure, the first electrode layer of the light emitting element in the second sub-pixel of second color comprises a second driving electrode block; an orthographic projection of the second driving electrode block on the base substrate at least partially overlaps with the orthographic projection of the gate electrode of the driving transistor in the second sub-pixel of second color on the base substrate.

For example, in the display panel provided by some embodiments of the present disclosure, a shape of the first driving electrode block is different from a shape of the auxiliary electrode block, the shape of the first driving electrode block is identical with a shape of the second driving electrode block, and an area of the orthographic projection of the first driving electrode block on the base substrate is identical with an area of the orthographic projection of the second driving electrode block on the base substrate.

For example, in the display panel provided by some embodiments of the present disclosure, a distance between a center of the gate electrode of the driving transistor of the pixel circuit of the first sub-pixel of second color and a center of the first driving electrode block is greater than a distance between a center of the gate electrode of the driving transistor of the pixel circuit of the second sub-pixel of second color and a center of the second driving electrode block.

For example, in the display panel provided by some embodiments of the present disclosure, the gate electrode of the driving transistor of the pixel circuit of the first sub-pixel of second color and the gate electrode of the driving transistor of the pixel circuit of the second sub-pixel of second color are arranged in a first direction, and the first direction is parallel to a surface of the base substrate, in the first direction, the first driving electrode block is on a side of the gate electrode of the driving transistor of the pixel circuit of the first sub-pixel of second color close to the gate electrode of the driving transistor of the pixel circuit of the second sub-pixel of second color.

For example, in the display panel provided by some embodiments of the present disclosure, in the first direction, the first driving electrode block is between the gate electrode of the driving transistor of the pixel circuit of the first sub-pixel of second color and the gate electrode of the driving transistor of the pixel circuit of the second sub-pixel of second color.

For example, in the display panel provided by some embodiments of the present disclosure, the pixel circuit further comprises a parasitic sub-circuit, the parasitic sub-circuit of the pixel circuit in the first sub-pixel of second color comprises a first capacitor, and the first capacitor comprises a first electrode and a second electrode, the auxiliary electrode block serves as the first electrode of the first capacitor, and the gate electrode of the driving transistor of the first sub-pixel of second color is multiplexed as the second electrode of the first capacitor.

For example, in the display panel provided by some embodiments of the present disclosure, the pixel circuit further comprises a parasitic sub-circuit, the parasitic sub-circuit of the pixel circuit in the second sub-pixel of second color comprises a second capacitor, and the second capacitor comprises a first electrode and a second electrode, the second driving electrode block serves as the first electrode of the second capacitor, and the gate electrode of the driving transistor of the second sub-pixel of second color is multiplexed as the second electrode of the second capacitor.

For example, in the display panel provided by some embodiments of the present disclosure, in each repeating unit, the first sub-pixel of second color and the second sub-pixel of second color are arranged along the first direction, and in the first direction, the auxiliary electrode block is on a side of the first driving electrode block away from the light emitting element of the second sub-pixel of second color.

For example, in the display panel provided by some embodiments of the present disclosure, in each repeating unit, the sub-pixel of first color and the sub-pixel of third color are arranged along a second direction, and in the second direction, the first sub-pixel of second color and the second sub-pixel of second color are between the sub-pixel of first color and the sub-pixel of third color, the second direction is parallel to the surface of the base substrate, and the first direction and the second direction are perpendicular to each other.

For example, in the display panel provided by some embodiments of the present disclosure, in each repeating unit, an area of the first electrode layer of the light emitting element of the first sub-pixel of second color is larger than an area of the first electrode layer of the light emitting element of the second sub-pixel of second color.

For example, the display panel provided by some embodiments of the present disclosure further comprises: a flat layer on a side of the pixel circuit away from the base substrate; the first electrode layer is on a side of the flat layer away from the driving transistor; the light emitting layer is on a side of the first electrode layer away from the flat layer; and the second electrode layer is on a side of the light emitting layer away from the first electrode layer.

For example, in the display panel provided by some embodiments of the present disclosure, the first electrode layer of the light emitting element in the first sub-pixel of second color further comprises a first connection electrode block, and the first connection electrode block is electrically connected to the first driving electrode block, in the first direction, the first connection electrode block is on a side of the first driving electrode block away from the light emitting element of the second sub-pixel of second color, the first electrode layer of the light emitting element in the second sub-pixel of second color further comprises a second connection electrode block, and the second connection electrode block is electrically connected to the second driving electrode block, in the first direction, the second connection electrode block is on a side of the second driving electrode block away from the light emitting element of the first sub-pixel of second color.

For example, in the display panel provided by some embodiments of the present disclosure, the flat layer comprises a first hole and a second hole, the first connection electrode block is electrically connected to the pixel circuit of the first sub-pixel of second color through the first hole, and the second connection electrode block is electrically connected to the pixel circuit of the second sub-pixel of second color through the second hole.

For example, in the display panel provided by some embodiments of the present disclosure, in the first direction, the first connection electrode block is on a side of the first driving electrode block away from the gate electrode of the driving transistor of the pixel circuit of the second sub-pixel of second color.

For example, in the display panel provided by some embodiments of the present disclosure, in the first direction, the first connection electrode block is between the gate electrode of the driving transistor of the pixel circuit of the first sub-pixel of second color and the gate electrode of the driving transistor of the pixel circuit of the second sub-pixel of second color.

For example, in the display panel provided by some embodiments of the present disclosure, in the first direction, the first connection electrode block is between the first driving electrode block and the auxiliary electrode block.

For example, in the display panel provided by some embodiments of the present disclosure, in the first direction, the second connection electrode block is on a side of the gate electrode of the driving transistor of the pixel circuit of the second sub-pixel of second color away from the gate electrode of the driving transistor of the pixel circuit of the first sub-pixel of second color, the second driving electrode block is between the second connection electrode block and the first driving electrode block.

For example, in the display panel provided by some embodiments of the present disclosure, a shape of the first connection electrode block is identical with a shape of the second connection electrode block, an area of an orthographic projection of the first connection electrode block on the base substrate is identical with an area of an orthographic projection of the second connection electrode block on the base substrate.

For example, in the display panel provided by some embodiments of the present disclosure, the first electrode layer of the light emitting element of the sub-pixel of first color comprises a third driving electrode block and a third connection electrode block that are electrically connected to each other, and the first electrode layer of the light emitting element of the sub-pixel of third color comprises a fourth driving electrode block and a fourth connection electrode block that are electrically connected to each other, the flat layer comprises a third hole and a fourth hole, and the third connection electrode block extends to the third hole and is electrically connected to the pixel circuit of the sub-pixel of first color through the third hole, and the fourth connection electrode block extends to the fourth hole and is electrically connected to the pixel circuit of the sub-pixel of third color through the fourth hole.

For example, in the display panel provided by some embodiments of the present disclosure, in each repeating unit, in the first direction, the third connection electrode block is on a side of the third driving electrode block away from the auxiliary electrode block, and in the second direction, the third connection electrode block is on a side of the third driving electrode block close to the fourth driving electrode block, in the first direction, the fourth connection electrode block is on a side of the fourth driving electrode block away from the auxiliary electrode block, and in the second direction, the fourth connection electrode block is on a side of the fourth driving electrode block close to the third driving electrode block.

For example, in the display panel provided by some embodiments of the present disclosure, the pixel circuit comprises an active semiconductor layer, a gate metal layer, and a source-drain metal layer, in a direction perpendicular to the base substrate, the active semiconductor layer is between the base substrate and the gate metal layer, and the gate metal layer is between the active semiconductor layer and the source-drain metal layer, the first connection electrode block extends to the source-drain metal layer through the first hole, the second connection electrode block extends to the source-drain metal layer through the second hole, the third connection electrode block extends to the source-drain metal layer through the third hole, and the fourth connection electrode block extends to the source-drain metal layer through the fourth hole.

For example, in the display panel provided by some embodiments of the present disclosure, the plurality of repeating units are arranged along a second direction to form a plurality of repeating unit groups, the plurality of repeating unit groups are arranged along the first direction, in the first direction, the first connection electrode block, the second connection electrode block, the third connection electrode block, and the fourth connection electrode block are between two adjacent repeating unit groups, and in the first direction, at least a part of the auxiliary electrode block is on a side of the auxiliary electrode block away from the first driving electrode block and between two adjacent repeating units in a repeating unit group adjacent to a repeating unit group where the auxiliary electrode block is located.

For example, in the display panel provided by some embodiments of the present disclosure, the sub-pixel of first color is a red sub-pixel, the two sub-pixels of second color are both green sub-pixels, and the sub-pixel of third color is a blue sub-pixel.

For example, in the display panel provided by some embodiments of the present disclosure, an area of an orthographic projection of the first electrode layer of the light emitting element in the sub-pixel of first color on the base substrate is larger than an area of an orthographic projection of the first electrode layer of the light emitting element in each of the two sub-pixels of second color on the base substrate, and is smaller than an area of an orthographic projection of the first electrode layer of the light emitting element in the sub-pixel of third color on the base substrate.

For example, in the display panel provided by some embodiments of the present disclosure, the pixel circuit further comprises a light emitting control sub-circuit, a data writing sub-circuit, a storage sub-circuit, a threshold compensation sub-circuit, a reference voltage writing sub-circuit, a first reset sub-circuit, and a second reset sub-circuit, the data writing sub-circuit is configured to write a data signal to a first end of the storage sub-circuit under control of a gate signal; the storage sub-circuit is configured to store the data signal; the driving transistor is configured to drive the light emitting element to emit light based on a voltage of a second end of the storage sub-circuit; the light emitting control sub-circuit is electrically connected to the driving transistor and the light emitting element, respectively, and is configured to achieve a connection between the driving transistor and the light emitting element to be turned on or off; the threshold compensation sub-circuit is electrically connected to the driving transistor, and is configured to perform threshold compensation on the driving transistor under control of a threshold compensation control signal; the reference voltage writing sub-circuit is electrically connected to the first end of the storage sub-circuit, and is configured to write a reference voltage signal to the first end of the storage sub-circuit under control of a reference voltage compensation control signal; the first reset sub-circuit is electrically connected to the first end of the storage sub-circuit, and is configured to write a first reset voltage to the first end of the storage sub-circuit under control of a first reset control signal; and the second reset sub-circuit is electrically connected to the second end of the storage sub-circuit, and is configured to write a second reset voltage to the second end of the storage sub-circuit under control of a second reset control signal.

At least some embodiments of the present disclosure further provide a manufacturing method of a display panel, and the manufacturing method comprises: obtaining a base substrate; and forming a plurality of sub-pixels on the base substrate. The plurality of sub-pixels constitute a plurality of repeating units, and each of the plurality of repeating units comprises a sub-pixel of first color, two sub-pixels of second color, and a sub-pixel of third color; each of the plurality of sub-pixels comprises a driving transistor and a light emitting element electrically connected to the driving transistor, and the light emitting element comprises a first electrode layer, a light emitting layer, and a second electrode layer; an orthographic projection of the first electrode layer of the light emitting element in each sub-pixel of second color on the base substrate at least partially overlaps with an orthographic projection of a gate electrode of the driving transistor in each sub-pixel of second color on the base substrate.

At least some embodiments of the present disclosure further provide a display device, comprising: the display panel according to any one of the above embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure. Those of ordinary skill in the art can obtain, without any inventive works, other drawings based on these drawings.

DETAILED DESCRIPTION

Figure 1:
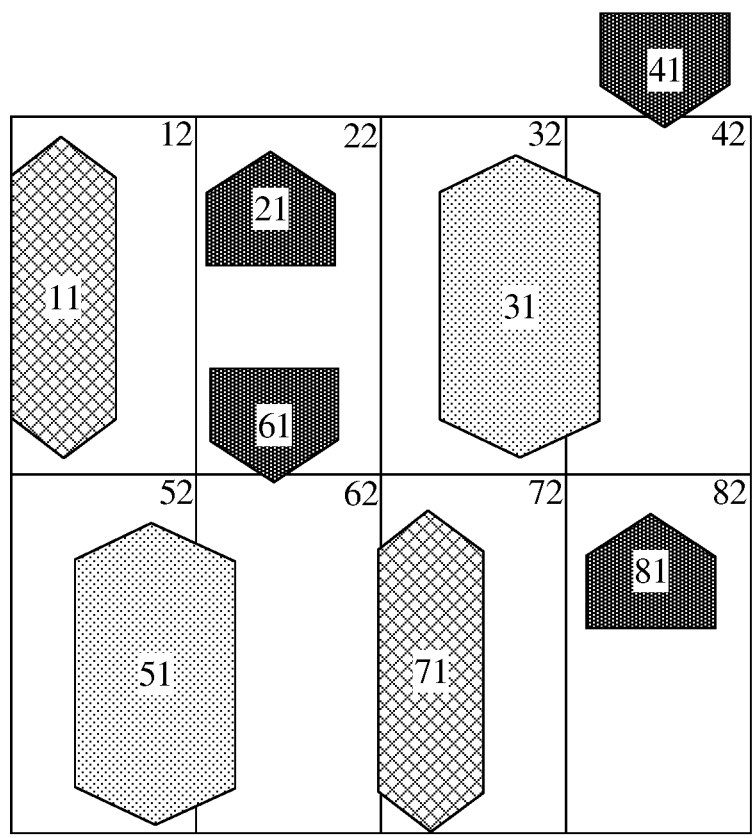
FIG. 1 is a schematic structural diagram of a display panel provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The transistors used in all the embodiments of the present disclosure can be thin film transistors, or field effect transistors, or other devices with the same characteristics. According to the roles of the transistors in the circuit, the transistors used in the embodiments of the present disclosure are mainly switching transistors. Because a source electrode and a drain electrode of a transistor used herein may be symmetrical in structures, and therefore, the source electrode and the drain electrode of the transistor may be interchangeable, and the source electrode and the drain electrode of the transistor are not distinguishable in physical structures. In the embodiments of the present disclosure, the source electrode of the switching transistor is referred to as a first electrode, and the drain electrode of the switching transistor is referred to as a second electrode. According to the form in the figures, a middle end of the transistor is specified as a gate electrode, a signal input end is the source electrode, and a signal output end is the drain electrode.

In addition, the switching transistors used in the embodiments of the present disclosure may include any one of a P-type switching transistor and an N-type switching transistor. The P-type switching transistor is turned on in the case where the gate electrode of the P-type switching transistor is at a low level, and is turned off in the case where the gate electrode of the P-type switching transistor is at a high level. The N-type switching transistor is turned on in the case where the gate electrode of the N-type switching transistor is at a high level, and is turned off in the case where the gate electrode of the N-type switching transistor is at a low level. In addition, each of a plurality of signals in various embodiments of the present disclosure correspondingly has a first potential and a second potential. The first potential and the second potential represent only two states of the potential of the signal, and do not indicate that the first potential or the second potential has a specific value throughout the specification.

With the development of display technology, in order to improve the resolution of the display panel under the premise of reducing costs, at present, a plurality of sub-pixels included in a display panel can be arranged in the order of red sub-pixel, green sub-pixel, blue sub-pixel, and green sub-pixel (that is, in the order of RGBG). In the display panel using the RGBG arrangement, the anodes of the respective sub-pixels can generally be arranged in the manner shown in FIG. 1. As shown in FIG. 1, regions 12 to 82 may be regions where pixel circuits of respective sub-pixels on a base substrate are located, and the pixel circuit may include a driving transistor (not shown in FIG. 1). Reference numerals 11 and 71 are anodes of the light emitting elements in the red sub-pixels, reference numerals 21, 41, 61, and 81 are anodes of the light emitting elements in the green sub-pixels, and numerals 31 and 51 are anodes of the light emitting elements in the blue sub-pixels.

In each sub-pixel, a parasitic capacitor ΔC exists between the anode of the light emitting element and the gate electrode of the driving transistor. The parasitic capacitor ΔC will affect the luminous brightness of the light emitting element. The larger the capacitance of the parasitic capacitor ΔC, the weaker the luminous brightness; and the smaller the capacitance of the parasitic capacitor ΔC, the stronger the luminous brightness. In addition, a magnitude of the capacitance of the parasitic capacitor ΔC is proportional to an overlap area between an orthographic projection of the anode of the light emitting element on the base substrate and an orthographic projection of the gate electrode of the driving transistor on the base substrate, that is, the larger the overlap area, the larger the capacitance of the parasitic capacitor ΔC; and the smaller the overlap area, the smaller the capacitance of the parasitic capacitor ΔC.

For example, in the display panel adopting the RGBG arrangement, the areas of the orthographic projections of the anodes of the light emitting elements in the respective sub-pixels on the base substrates are different. Affected by factors such as the arrangement of the sub-pixels, the sizes of the anodes of the light emitting elements, and the sizes of the sub-pixels, the display panel is prone to the phenomenon of poor brightness uniformity. For example, the brightness uniformity among the red sub-pixels is relatively good, that is, the overlap areas between the orthographic projections of the anodes of the light emitting elements in respective red sub-pixels on the base substrate and the orthographic projections of the gate electrodes of the driving transistors in the pixel circuits of the respective red sub-pixels on the base substrate are all equal; the brightness uniformity among the blue sub-pixels is also relatively good, that is, the overlap areas between the orthographic projections of the anodes of the light emitting elements in respective blue sub-pixels on the base substrate and the orthographic projections of the gate electrodes of the driving transistors in the pixel circuits of the respective blue sub-pixels on the base substrate are also all equal. However, the brightness uniformity among the green sub-pixels is poor, that is, there is a large difference in the overlap areas between the orthographic projections of the anodes of the light emitting elements in respective green sub-pixels on the base substrate and the orthographic projections of the gate electrodes of the driving transistors in the pixel circuits of the respective green sub-pixels on the base substrate, which easily causes difference in the luminous brightness of the light emitting elements in the respective green sub-pixels.

For example, referring to FIG. 1, an overlap area between an orthographic projection of an anode of a light emitting element in a red sub-pixel (such as the anode 11 of the red sub-pixel) on the base substrate and an orthographic projection of a gate electrode of a driving transistor of a pixel circuit of the red sub-pixel (such as the pixel circuit in region 12) on the base substrate is equal to an overlap area between an orthographic projection of an anode of a light emitting element in another red sub-pixel (such as the anode 71 of the red sub-pixel) on the base substrate and an orthographic projection of a gate electrode of a driving transistor of a pixel circuit of the another red sub-pixel (such as the pixel circuit in region 72) on the base substrate.

Referring to FIG. 1, an overlap area between an orthographic projection of an anode of a light emitting element in a blue sub-pixel (such as the anode 31 of the blue sub-pixel) on the base substrate and an orthographic projection of a gate electrode of a driving transistor of a pixel circuit of the blue sub-pixel (such as the pixel circuit in region 32) on the base substrate is equal to an overlap area between an orthographic projection of an anode of a light emitting element in another blue sub-pixel (such as the anode 51 of the blue sub-pixel) on the base substrate and an orthographic projection of a gate electrode of a driving transistor of a pixel circuit of the another blue sub-pixel (such as the pixel circuit in region 52) on the base substrate.

Referring to FIG. 1, in two adjacent green sub-pixels, an overlap area between an orthographic projection of an anode of a light emitting element in a green sub-pixel (such as the anode 21 of the green sub-pixel) on the base substrate and an orthographic projection of a gate electrode of a driving transistor of a pixel circuit of the green sub-pixel (such as the pixel circuit in region 22) on the base substrate is larger than an overlap area between an orthographic projection of an anode of a light emitting element in the other green sub-pixel (such as the anode 61 of the green sub-pixel) on the base substrate and an orthographic projection of a gate electrode of a driving transistor of a pixel circuit of the other green sub-pixel (such as the pixel circuit in region 62) on the base substrate. For example, the orthographic projection of the anode 61 of the light emitting element in the other green sub-pixel on the base substrate does not overlap with the orthographic projection of the gate electrode of the driving transistor in the pixel circuit of the other green sub-pixel (for example, the pixel circuit in region 62) on the base substrate.

Correspondingly, as a result, in the two adjacent green sub-pixels, the capacitance of the parasitic capacitor ΔC21 between the anode 21 of the light emitting element in one green sub-pixel and the gate electrode of the driving transistor in the green sub-pixel is larger, and the capacitance of the parasitic capacitor ΔC61 between the anode 61 of the light emitting element in the other green sub-pixel and the gate electrode of the driving transistor in the green sub-pixel is smaller (for example, ΔC61 is 0), furthermore resulting in that there is a large difference in the display brightness of the light emitting elements in the two adjacent green sub-pixels, for example, under a low gray level (such as 64 gray levels). The display brightness uniformity of the display panel is poor and the display effect of the display panel is poor.

Embodiments of the present disclosure provide a display panel and a manufacturing method thereof, and a display device. The display panel comprises: a base substrate and a plurality of sub-pixels disposed on the base substrate, the plurality of sub-pixels constitute a plurality of repeating units, each of the plurality of repeating units comprises a sub-pixel of first color, two sub-pixels of second color, and a sub-pixel of third color; each of the plurality of sub-pixels comprises a driving transistor and a light emitting element electrically connected to the driving transistor, and the light emitting element comprises a first electrode layer, a light emitting layer, and a second electrode layer; an orthographic projection of the first electrode layer of the light emitting element in each sub-pixel of second color on the base substrate at least partially overlaps with an orthographic projection of a gate electrode of the driving transistor in the each sub-pixel of second color on the base substrate.

In the display panel, there is small difference or no difference in the brightness of the light emitting elements of the respective sub-pixels of second color, the brightness uniformity of the display panel is good, and the display effect of the display device is good, so that the problem that the display effect of the display panel is poor can be solved.

Figure 2:
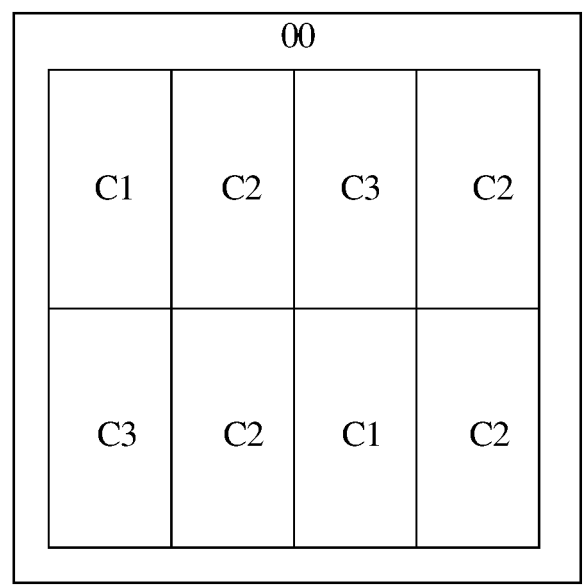
FIG. 2 is a schematic structural diagram of another display panel provided by some embodiments of the present disclosure.
Figure 3:
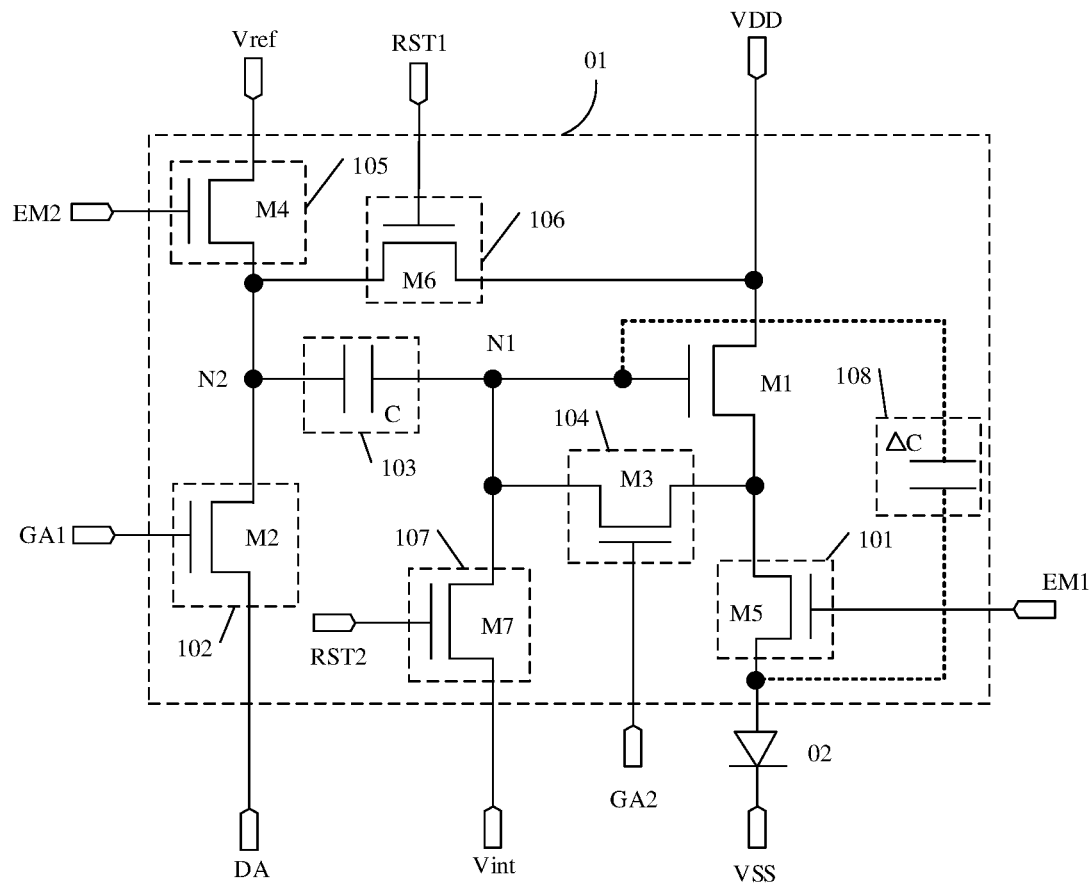
FIG. 3 is a schematic structural diagram of a sub-pixel provided by some embodiments of the present disclosure.
Figure 4:
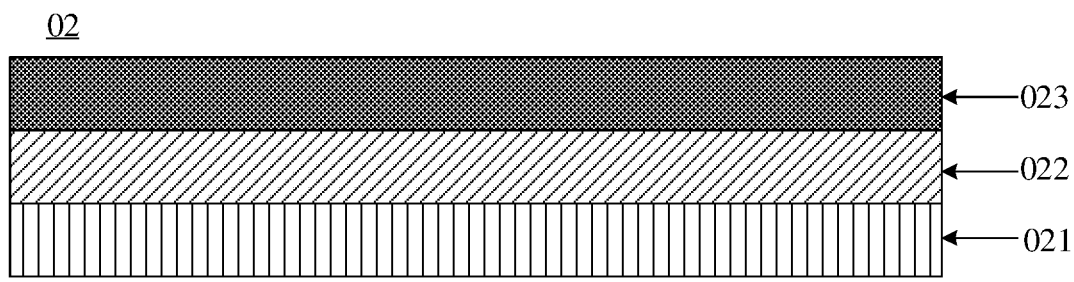
FIG. 4 is a schematic structural diagram of a light emitting element provided by some embodiments of the present disclosure.
Figure 5:
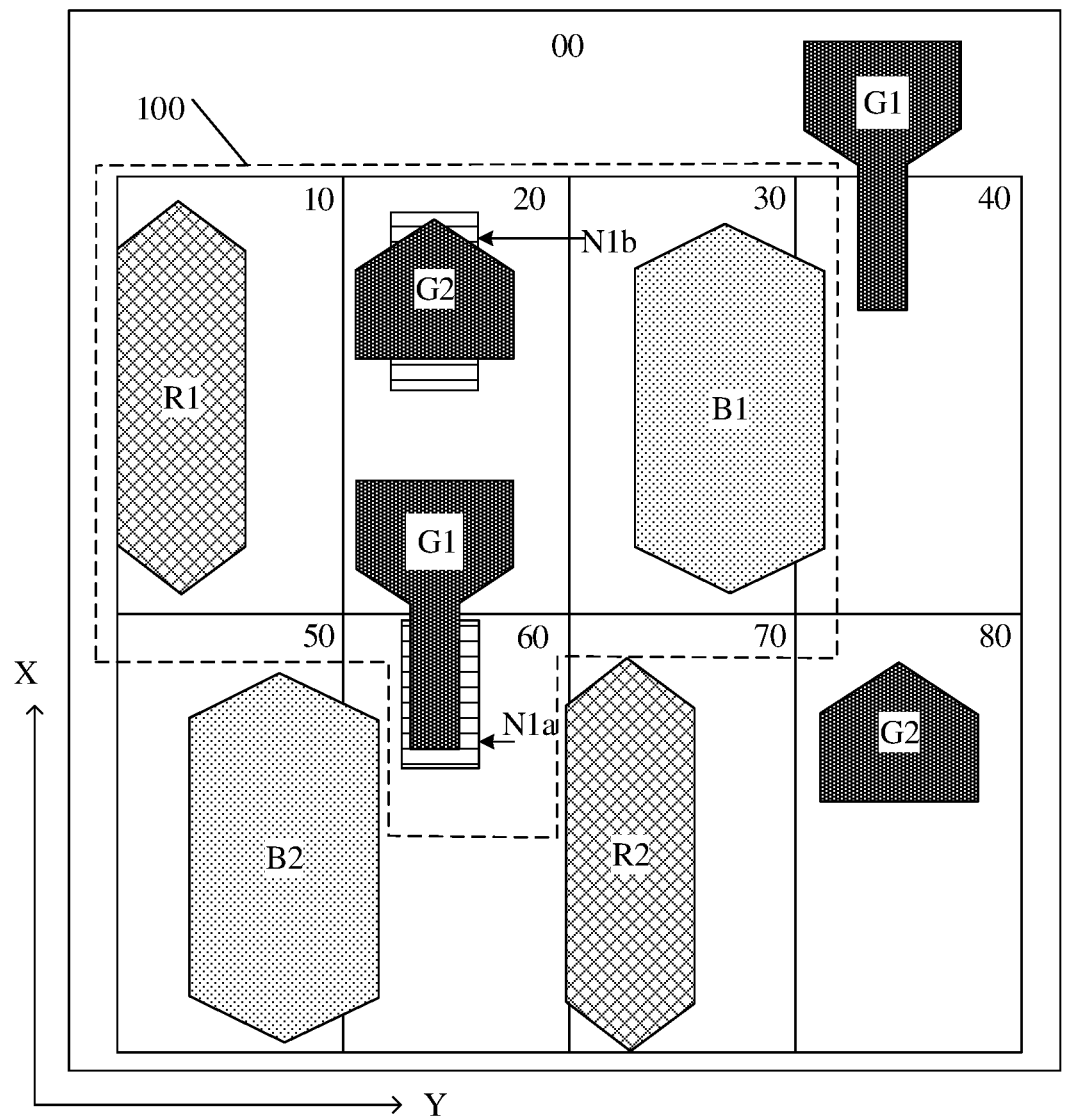
FIG. 5 is a schematic structural diagram of still another display panel provided by some embodiments of the present disclosure.

FIG. 2 is a schematic structural diagram of another display panel provided by some embodiments of the present disclosure; FIG. 3 is a schematic structural diagram of a sub-pixel provided by some embodiments of the present disclosure; FIG. 4 is a schematic structural diagram of a light emitting element provided by some embodiments of the present disclosure; FIG. 5 is a schematic structural diagram of still another display panel provided by some embodiments of the present disclosure.

For example, as shown in FIG. 2, the display panel may include a base substrate 00 and a plurality of sub-pixels (FIG. 2 only shows 8 sub-pixels as an example) disposed on the base substrate 00, for example, at least some of the plurality of sub-pixels have different colors. For example, the plurality of sub-pixels may include a plurality of sub-pixels of first color, a plurality of sub-pixels of second color, and a plurality of sub-pixels of third color. The plurality of sub-pixels may be arranged in the order of the sub-pixel of first color C1, the sub-pixel of second color C2, the sub-pixel of third color C3, and the sub-pixel of second color C2.

For example, the base substrate 00 may be a suitable substrate such as a glass substrate, a quartz substrate, or a plastic substrate.

For example, as shown in FIG. 5, the plurality of sub-pixels may form a plurality of repeating units 100, and each repeating unit 100 may include a sub-pixel of first color C1, two sub-pixels of second color C2, and a sub-pixel of third color C3. The two sub-pixels of second color C2 may include a first sub-pixel of second color and a second sub-pixel of second color.

For example, as shown in FIG. 3, each sub-pixel may include a pixel circuit 01 and a light emitting element 02. The pixel circuit 01 may include a driving transistor M1, and the driving transistor M1 is electrically connected to the light emitting element 02. For example, the driving transistor M1 may be connected to a first end of the light emitting element 02 (such as an anode of the light emitting element 02), and is configured to drive the light emitting element 02 to emit light.

For example, the light emitting element 02 may be a light emitting diode, and the light emitting diode may be, for example, an organic light emitting diode (OLED), a quantum dot light emitting diode (QLED), or the like, but the embodiments of the present disclosure are not limited thereto. In addition, referring to FIG. 3, it can be seen that there is a parasitic capacitor ΔC between the anode of the light emitting element 02 and the gate electrode N1 of the driving transistor M1.

For example, as shown in FIG. 4, the light emitting element 02 in each sub-pixel may include a first electrode layer 021, a light emitting layer 022, and a second electrode layer 023. The light emitting layer 022 is disposed between the first electrode layer 021 and the second electrode layer 023.

For example, an orthographic projection of the first electrode layer 021 in a sub-pixel of second color C2 on the base substrate 00 at least partially overlaps with an orthographic projection of the gate electrode N1 of the driving transistor M1 in the sub-pixel of second color C2 on the base substrate 00. For example, an orthographic projection of the first electrode layer in the first sub-pixel of second color on the base substrate 00 at least partially overlaps with an orthographic projection of the gate electrode of the driving transistor M1 in the first sub-pixel of second color on the base substrate 00, and an orthographic projection of the first electrode layer in the second sub-pixel of second color on the base substrate 00 at least partially overlaps with an orthographic projection of the gate electrode of the driving transistor M1 in the second sub-pixel of second color on the base substrate 00.

For example, in some embodiments, the orthographic projection of the gate electrode N1 of the driving transistor M1 in each sub-pixel of second color C2 on the base substrate 00 is located within the orthographic projection of the first electrode layer 021 in each sub-pixel of second color C2 on the base substrate 00. That is, the orthographic projection of the gate electrode of the driving transistor M1 in the first sub-pixel of second color on the base substrate 00 is within the orthographic projection of the first electrode layer in the first sub-pixel of second color on the base substrate 00, and the orthographic projection of the gate electrode of the driving transistor M1 in the second sub-pixel of second color on the base substrate 00 is within the orthographic projection of the first electrode layer in the second sub-pixel of second color on the base substrate 00. That is, the orthographic projection of the first electrode layer in the first sub-pixel of second color on the base substrate 00 completely covers the orthographic projection of the gate electrode of the driving transistor M1 in the first sub-pixel of second color on the base substrate 00, and the orthographic projection of the first electrode layer in the second sub-pixel of second color on the base substrate 00 completely covers the orthographic projection of the gate electrode of the driving transistor M1 in the second sub-pixel of second color on the base substrate 00.

For example, the first electrode layer 021 may be the anode of the light emitting element 02, and the second electrode layer 023 may be the cathode of the light emitting element 02. For example, an orthographic projection of the light emitting layer 022 on the base substrate 00 at least partially overlaps with an orthographic projection of the second electrode layer 023 on the base substrate 00. For example, the orthographic projection of the light emitting layer 022 of the light emitting element of the first sub-pixel of second color C2 on the base substrate 10 and the orthographic projection of the light emitting layer 022 of the light emitting element of the second sub-pixel of second color C2 on the base substrate 00 are continuous, that is, the light emitting layer 022 of the light emitting element of the first sub-pixel of second color C2 and the light emitting layer 022 of the light emitting element of the second sub-pixel of second color C2 may be made by one opening in a high-precision metal mask (FMM), thereby effectively reducing the process difficulty of the FMM. For example, the light emitting layer 022 of the light emitting element of the first sub-pixel of second color C2 and the light emitting layer 022 of the light emitting element of the second sub-pixel of second color C2 are integrated.

For example, for each sub-pixel, in a region where the orthographic projection of the first electrode layer 021 on the base substrate 00, the orthographic projection of the light emitting layer 022 on the base substrate 00, and the orthographic projection of the second electrode layer 023 on the base substrate 00 overlap, a portion corresponding to the opening of a pixel defining layer is used for light emitting.

For example, the material of the light emitting layer 022 can be selected according to the color of the light emitted from the light emitting element 02. The material of the light emitting layer 022 includes a fluorescent light emitting material, a phosphorescent light emitting material, or the like. For example, in some embodiments, the first electrode layer 021 and the second electrode layer 023 are both made of a conductive material.

For example, in each repeating unit 100, the area of the first electrode layer of the light emitting element of the first sub-pixel of second color C1 is larger than the area of the first electrode layer of the light emitting element of the second sub-pixel of second color C2.

FIG. 5 is a schematic diagram showing a plane structure of first electrode layers of light emitting units of respective sub-pixels and gate electrodes of driving transistors of respective sub-pixels on a base substrate according to an embodiment of the present disclosure. For example, as shown in FIG. 5, regions 10 to 80 are regions where the pixel circuits 01 of respective sub-pixels are located, and R1, R2 represent the first electrode layer (that is, the anode) of the light emitting element in the sub-pixel of first color, G1 represents the first electrode layer (that is, anode) of the light emitting element in the first sub-pixel of second color, G2 represents the first electrode layer (that is, anode) of the light emitting element in the second sub-pixel of second color, and B1, B2 represent the first electrode layer (that is, the anode) of the light emitting element in the sub-pixel of third color.

It should be noted that, as shown in FIG. 5, regions 10 and 50 may be located in a first column, regions 20 and 60 may be located in a second column, regions 30 and 70 may be located in a third column, and regions 40 and 80 may be located in a fourth column Regions 10, 20, 30, and 40 may be located in a first row, and regions 50, 60, 70, and 80 may be located in a second row.

For example, referring to FIG. 5, it can be seen that, in the embodiments of the present disclosure, the two sub-pixels of second color in the repeating unit 100 may be located in the second column and adjacent to each other, the orthographic projection of the anode G2 of the light emitting element 02 in the second sub-pixel of second color on the base substrate 00 at least partially overlaps with the orthographic projection of the gate electrode N1b of the driving transistor in the pixel circuit 01 (i.e., the pixel circuit located in the region 20) of the second sub-pixel of second color on the base substrate 00; the orthographic projection of the anode G1 of the light emitting element 02 in the first sub-pixel of second color on the base substrate 00 also at least partially overlaps with the orthographic projection of the gate electrode N1a of the driving transistor in the pixel circuit 01 (that is, the pixel circuit in the region 60) of the first sub-pixel of second color on the base substrate 00.

With respect to the display panel shown in FIG. 1, the orthographic projection of the anode 61 of the light emitting element in the first sub-pixel of second color on the base substrate 00 and the orthographic projection of the gate electrode of the driving transistor in the pixel circuit 01 of the first sub-pixel of second color on the base substrate 00 do not overlap, however in the display panel provided by the embodiments of the present disclosure, the orthographic projection of the anode G1 of the light emitting element 02 in the first sub-pixel of second color on the base substrate 00 at least partially overlaps with the orthographic projection of the gate electrode N1a of the driving transistor in the pixel circuit 01 (that is, the pixel circuit in the region 60) of the first sub-pixel of second color on the base substrate 00, thus, among two adjacent sub-pixels of second color, a difference between the parasitic capacitance between the anode G1 of the light emitting element 02 in the first sub-pixel of second color and the gate electrode N1a of the driving transistor in the first sub-pixel of second color and the parasitic capacitance between the anode G2 of the light emitting element 02 in the second sub-pixel of second color and the gate electrode N1b of the driving transistor in the second sub-pixel of second color is small.

In summary, in the display panel provided by the embodiments of the present disclosure, because in the display panel, the orthographic projection of the first electrode layer in each sub-pixel of second color on the base substrate overlaps with the orthographic projection of the gate electrode of the driving transistor in the sub-pixel of second color on the base substrate, and therefore, a difference between the capacitance of the parasitic capacitor between the first electrode layer of the light emitting element in the first sub-pixel of second color of the two sub-pixels of second color and the gate electrode of the driving transistor in the first sub-pixel of second color and the capacitance of the parasitic capacitor between the first electrode layer in the second sub-pixel of second color of the two sub-pixels of second color and the gate electrode of the driving transistor in the second sub-pixel of second color is small, and furthermore, the brightness difference among the light emitting elements of the respective sub-pixels of second color can be small or there is no brightness difference, the brightness uniformity of the display panel is good, and the display effect of the display device is good.

For example, as shown in FIG. 3, the pixel circuit 01 in each sub-pixel further includes a light emitting control sub-circuit 101, a data writing sub-circuit 102, a storage sub-circuit 103, a threshold compensation sub-circuit 104, and a reference voltage writing sub-circuit 105, a first reset sub-circuit 106, and a second reset sub-circuit 107.

For example, the data writing sub-circuit 102 is configured to write a data signal to the first end of the storage sub-circuit 103 under the control of a gate signal; the storage sub-circuit 103 is configured to store the data signal; the driving transistor M1 is configured to drive the light emitting element 02 to emit light based on the voltage of the second end of the storage sub-circuit 103; the light emitting control sub-circuit 101 is electrically connected to the driving transistor M1 and the light emitting element 02, respectively, and is configured to achieve the connection between the driving transistor M1 and the light emitting element 02 to be turned on or off; the threshold compensation sub-circuit 104 is electrically connected to the driving transistor M1 and is configured to perform threshold compensation on the driving transistor M1 under the control of a threshold compensation control signal; the reference voltage writing sub-circuit 105 is electrically connected to the first end of the storage sub-circuit 103 and is configured to write a reference voltage signal to the first end of the storage sub-circuit 103 under the control of a reference voltage compensation control signal; the first reset sub-circuit 106 is electrically connected to the first end of the storage sub-circuit 103 and is configured to write a first reset voltage to the first end of the storage sub-circuit 103 under the control of a first reset control signal; and the second reset sub-circuit 107 is electrically connected to the second end of the storage sub-circuit 103 and is configured to write a second reset voltage to the second end of the storage sub-circuit 103 under the control of a second reset control signal.

For example, as shown in FIG. 3, the data writing sub-circuit 102 may include a data writing transistor M2, the threshold compensation sub-circuit 104 may include a threshold compensation transistor M3, the light emitting control sub-circuit 101 may include a light emitting control transistor M5, the reference voltage writing sub-circuit 105 may include a reference voltage writing transistor M4, the first reset sub-circuit 106 may include a first reset transistor M6, and the second reset sub-circuit 107 may include a second reset transistor M7, and the storage sub-circuit 103 may include a storage capacitor C.

For example, a gate electrode of the driving transistor M1 is electrically connected to a second electrode of the storage capacitor C, a first electrode of the driving transistor M1 is electrically connected to a first DC power terminal VDD, and a second electrode of the driving transistor M1 is connected to a first electrode of the light emitting control transistor M5.

For example, a gate electrode of the data writing transistor M2 is electrically connected to a first gate signal terminal GA1 to receive a gate signal, a first electrode of the data writing transistor M2 is electrically connected to a data signal terminal DA, and a second electrode is electrically connected to a control node N2 (that is, the first end of the storage sub-circuit 103), and the data writing transistor M2 is used to input the data signal provided by the data signal terminal DA to the control node N2 under the control of the gate signal provided by the first gate signal terminal GA1.

For example, a gate electrode of the threshold compensation transistor M3 is electrically connected to a second gate signal terminal GA2 to receive the threshold compensation control signal, a first electrode of the threshold compensation transistor M3 is connected to the gate electrode N1 of the driving transistor M1, a second electrode of the threshold compensation transistor M3 is connected to the second electrode of the driving transistor M1. The threshold compensation transistor M3 is used to adjust the voltage of the second electrode (for example, the drain electrode) of the driving transistor M1 according to the voltage of the gate electrode N1 of the driving transistor M1 under the control of the threshold compensation control signal, thereby achieving to perform threshold compensation on the driving transistor M1.

For example, the gate signal and the threshold compensation control signal may be the same, that is, the gate electrode of the data writing transistor M2 and the gate electrode of the threshold compensation transistor M3 may be electrically connected to the same signal terminal, such as the first gate signal terminal GA1, to receive the same signal (for example, the gate signal), in this case, the display panel may not be provided with the second gate signal terminal GA2, thereby reducing the number of signal terminals. For another example, the gate electrode of the data writing transistor M2 and the gate electrode of the threshold compensation transistor M3 may be electrically connected to different signal terminals, respectively, that is, the gate electrode of the data writing transistor M2 is electrically connected to the first gate signal terminal GA1, the gate electrode of the threshold compensation transistor M3 is electrically connected to the second gate signal terminal GA2, and the first gate signal terminal GA1 and the second gate signal terminal GA2 transmit the same signal.

It should be noted that the gate signal and the threshold compensation control signal may also be different, so that the gate electrode of the data writing transistor M2 and the gate electrode of the threshold compensation transistor M3 can be controlled separately, thereby increasing the flexibility of controlling the pixel circuit.

For example, a gate electrode of the reference voltage writing transistor M4 is electrically connected to a reference control signal terminal EM2, a first electrode of the reference voltage writing transistor M4 is electrically connected to the reference voltage signal terminal Vref, and a second electrode of the reference voltage writing transistor M4 is electrically connected to the control node N2. The reference voltage writing transistor M4 is used to input the reference voltage signal provided by the reference voltage signal terminal Vref to the control node N2 under the control of the reference voltage compensation control signal provided by the reference control signal terminal EM2.

For example, a gate electrode of the light emitting control transistor M5 is electrically connected to the light emitting control signal terminal EM1, a first electrode of the light emitting control transistor M5 is connected to the second electrode of the driving transistor M1, and a second electrode of the light emitting control transistor M5 is connected to the anode of the light emitting element 02. The light emitting control transistor M5 is configured to connect the second electrode of the driving transistor M1 to the anode of the light emitting element 02 under the control of the light emitting control signal provided by the light emitting control signal terminal EM1, so that the driving transistor M1 outputs a driving current to the light emitting element 02 to drive the light emitting element 02 to emit light. The light emitting control transistor M5 is further configured to disconnect the second electrode of the driving transistor M1 and the anode of the light emitting element 02 under the control of the light emitting control signal provided by the light emitting control signal terminal EM2 to ensure that the light emitting element 02 does not emit light.

For example, the reference voltage compensation control signal and the light emitting control signal may be the same, that is, the gate electrode of the reference voltage writing transistor M4 and the gate electrode of the light emitting control transistor M5 may be electrically connected to the same signal terminal, such as the light emitting control signal terminal EM2, to receive the same signal (for example, the light emitting control signal). In this case, the display panel may not be provided with the reference control signal terminal EM1, thereby reducing the number of signal terminals. For another example, the gate electrode of the reference voltage writing transistor M4 and the gate electrode of the light emitting control transistor M5 may be electrically connected to different signal terminals, respectively, that is, the gate electrode of the reference voltage writing transistor M4 is electrically connected to the reference control signal terminal EM2, and the gate electrode of the light emitting control transistor M5 is electrically connected to the light emitting control signal terminal EM1, and the signal transmitted by the reference control signal terminal EM1 and the signal transmitted by the light emitting control signal terminal EM2 are the same.

It should be noted that in a case where the reference voltage writing transistor M4 and the light emitting control transistor M5 are different types of transistors, for example, in a case where the reference voltage writing transistor M4 is a P-type transistor and the light emitting control transistor M5 is an N-type transistor, the reference voltage compensation control signal and the light emitting control signal may also be different, and the embodiments of the present disclosure are not limited thereto.

For example, a gate electrode of the first reset transistor M6 is electrically connected to the first reset signal terminal RST1, a first electrode of the first reset transistor M6 is electrically connected to the control node N2, and a second electrode of the first reset transistor M6 is electrically connected to the first DC power terminal VDD. The first DC power terminal VDD is used to provide a first DC voltage as the first reset voltage, and the first reset transistor M6 is configured to input the first DC voltage provided by the first DC power terminal VDD, that is, the first reset voltage, to the control node N2 under the control of the first reset control signal provided by the first reset signal terminal RST1. It should be noted that the second electrode of the first reset transistor M6 may also be electrically connected to a reset power terminal provided separately.

For example, a gate electrode of the second reset transistor M7 is electrically connected to the second reset signal terminal RST2, a first electrode of the second reset transistor M7 is electrically connected to the initialization signal terminal Vint, and a second electrode of the second reset transistor M7 is connected to the gate electrode N1 of the driving transistor M1. The initialization signal terminal Vint is used to provide an initialization signal as the second reset voltage. The second reset transistor M7 is used to input the initialization signal, that is, the second reset voltage, provided by the initialization signal terminal Vint to the gate electrode N1 of the driving transistor M1 under the control of the second reset control signal provided by the second reset signal terminal RST2.

For example, the first reset control signal and the second reset control signal may be the same, that is, the gate electrode of the first reset transistor M6 and the gate electrode of the second reset transistor M7 may be electrically connected to the same signal terminal, such as the first reset signal terminal RST1, to receive the same signal (for example, the first reset control signal). In this case, the display panel may not be provided with the second reset signal terminal RST2, thereby reducing the number of signal terminals. For another example, the gate electrode of the first reset transistor M6 and the gate electrode of the second reset transistor M7 may be electrically connected to different signal lines, respectively, that is, the gate electrode of the first reset transistor M6 is electrically connected to the first reset signal terminal RST1, the gate electrode of the second reset transistor M7 is electrically connected to the second reset signal terminal RST2, and the signal transmitted by the first reset signal terminal RST1 and the signal transmitted by the second reset signal terminal RST2 are the same. It should be noted that the first reset control signal and the second reset control signal may also be different.

For example, the first end of the storage sub-circuit 103 includes a first electrode of the storage capacitor C, and the second end of the storage sub-circuit 103 includes a second electrode of the storage capacitor C. The first electrode of the storage capacitor C is connected to the control node N2, the second electrode of the storage capacitor C is connected to the gate electrode N1 of the driving transistor M1, and the storage capacitor C is used to store the potential of the gate electrode N1 of the driving transistor M1.

For example, the cathode of the light emitting element 02 is electrically connected to a second DC power terminal VSS.

For example, one of the first DC power terminal VDD and the second DC power terminal VSS is a high voltage terminal, and the other of the first DC power terminal VDD and the second DC power terminal VSS is a low voltage terminal. For example, in the embodiment shown in FIG. 3, the first DC power terminal VDD is a voltage source to output a first DC voltage that is constant, and the first DC voltage is a positive voltage; while the second DC power terminal VSS can be a voltage source to output a second DC voltage that is constant, and the second DC voltage is a negative voltage. For example, in some examples, the second DC power terminal VSS may be grounded.

It should be noted that, in the embodiments of the present disclosure, in addition to the structure of 7T1C (that is, seven transistors and a capacitor) shown in FIG. 3, the sub-pixel may also have a structure including other numbers of transistors, such as a 6T1C structure or a 9T1C structure, and the embodiments of the present disclosure do not limit the structure of the sub-pixel.

For example, as shown in FIG. 3, the pixel circuit 01 further includes a parasitic sub-circuit 108, the parasitic sub-circuit 108 includes a parasitic capacitor ΔC, and the parasitic capacitor ΔC is a parasitic capacitor existing between the anode of the light emitting element and the gate electrode of the driving transistor in the sub-pixel. A first electrode of the parasitic capacitor ΔC is electrically connected to the gate electrode of the driving transistor M1, and a second electrode of the parasitic capacitor ΔC is electrically connected to the anode of the light emitting element 02.

It should be noted that in the case where there is a parasitic capacitor ΔC between the anode of the light emitting element and the gate electrode of the driving transistor in the sub-pixel, the brightness of the respective light emitting elements in the display panel may also differ due to the difference in ΔC.

Figure 6:
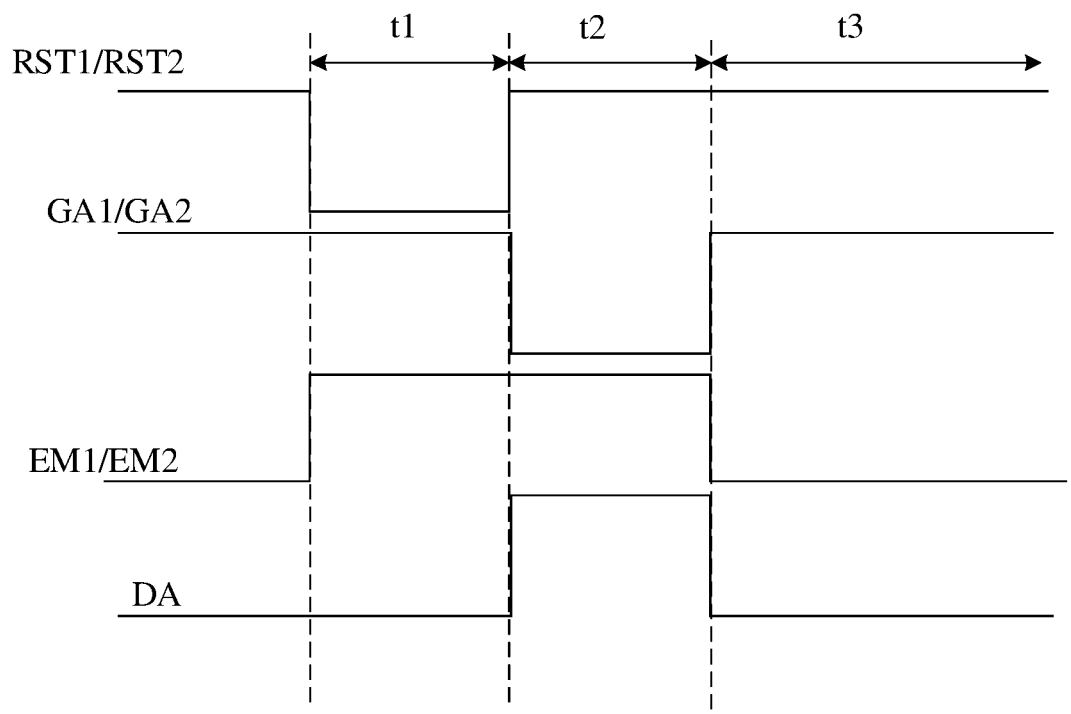
FIG. 6 is a timing diagram of various signal terminals in a pixel circuit of a sub-pixel provided by some embodiments of the present disclosure.

FIG. 6 is a timing diagram of various signal terminals in a pixel circuit 01 of a sub-pixel shown in FIG. 3 provided by some embodiments of the present disclosure. It should be noted that, in the example shown in FIG. 6, the signal provided by the first reset signal terminal RST1 and the signal provided by the second reset signal terminal RST2 are the same, the signal provided by the first gate signal terminal GA1 and the signal provided by the second gate signal terminal GA2 are the same, and the signal provided by the reference control signal terminal EM2 and the signal provided by the light emitting control signal terminal EM1 are the same. All the transistors in the pixel circuit 01 are P-type transistors.

For example, referring to FIG. 3 and FIG. 6, in a reset phase t1, a potential of the first reset control signal provided by the first reset signal terminal RST1 and a potential of the second reset control signal provided by the second reset signal terminal RST2 are at a first potential, the first DC voltage (i.e., the first reset voltage) provided by the first DC power terminal VDD is at a second potential, and the initialization signal (i.e., the second reset voltage) provided by the initialization signal terminal Vint is at the second potential. Both the first reset transistor M6 and the second reset transistor M7 are turned on, the initialization signal terminal Vint inputs the initialization signal that is at the second potential to the gate electrode N1 of the driving transistor M1 through the second reset transistor M7, the first DC power terminal VDD inputs the first DC voltage that is at the second potential to the first electrode of the storage capacitor C through the first reset transistor M6. Thus, the gate electrode N1 of the driving transistor M1 and the first electrode of the storage capacitor C are reset. Because the potential of the gate electrode N1 of the driving transistor M1 is the second potential, the driving transistor M1 is turned off.

For example, during the reset phase t1, the potential of the gate signal provided by the first gate signal terminal GA1, the potential of the threshold compensation control signal provided by the second gate signal terminal GA2, the potential of the reference voltage compensation control signal provided by the reference control signal terminal EM2, and the potential of the light emitting control signal provided by the light emitting control signal terminal EM1 are all at the second potential, and therefore, the data writing transistor M2, the threshold compensation transistor M3, the reference voltage writing transistor M4, and the light emitting control transistor M5 are all turned off.

For example, referring to FIG. 3 and FIG. 6, in a data writing phase t2, the potential of the data signal provided by the data signal terminal DA is the first potential, the potential of the gate signal provided by the first gate signal terminal GA1 and the potential of the threshold compensation control signal provided by the second gate signal terminal GA2 are both the first potential, and both the data writing transistor M2 and the threshold compensation transistor M3 are turned on. The data signal terminal DA inputs the data signal Vdata that is at the first potential to the control node N2 through the data writing transistor M2, and the potential of the gate electrode N1 of the driving transistor M1 changes from the second potential to the first potential due to the coupling effect of the storage capacitor C, and thus, the driving transistor M1 is turned on.

For example, the first DC power terminal VDD outputs the first DC voltage that is at the first potential to the second electrode (for example, the drain electrode) of the driving transistor M1 through the driving transistor M1. The data writing transistor M3 pulls up the voltage of the gate electrode N1 of the driving transistor M1 according to the voltage of the drain electrode of the driving transistor M1, and the driving transistor M1 is fully turned on. In the case where the voltage of the gate electrode N1 of the driving transistor M1 is Vg=V1+Vth, where V1 is the first DC voltage and Vth is the threshold voltage of the driving transistor M1, and in the case where a voltage difference VGS between the first electrode of the driving transistor M1 (the voltage of the first electrode of the driving transistor M1 is the first DC voltage V1) and the gate electrode N1 is equal to the threshold voltage Vth of the driving transistor M1, that is, VGS=Vth, the driving transistor M1 is turned off. At this time, in the data writing phase t2, the threshold compensation operation of the driving transistor M1 can be achieved.

For example, referring to FIG. 3 and FIG. 6, during the data writing phase t2, the potential of the first reset control signal provided by the first reset signal terminal RST1, the potential of the second reset control signal provided by the second reset signal terminal RST2, the potential of the reference voltage compensation control signal provided by the reference control signal terminal EM2, and the potential of the light emitting control signal provided by the light emitting control signal terminal EM1 are all at the second potential, and thus, the reference voltage writing transistor M4, the light emitting control transistor M5, the first reset transistor M6, and the second reset transistor M7 are all turned off.

For example, referring to FIG. 3 and FIG. 6, in a light emitting phase t3, the potential of the reference voltage compensation control signal provided by the reference control signal terminal EM2 and the potential of the light emitting control signal provided by the light emitting control signal terminal EM1 are both at the first potential. The reference voltage writing transistor M4 and the light emitting control transistor M5 are both turned on, the reference voltage writing transistor M4 is turned on, and the reference voltage signal Vr is written to the control node N2, that is, the first electrode of the storage capacitor C, through the reference voltage writing transistor M4, so that the voltage at the control node N2 becomes the reference voltage signal Vr. Due to the bootstrap effect of the storage capacitor C, the voltage on the second electrode of the storage capacitor C becomes Vr-Vdata+V1+Vth, that is, the voltage on the gate electrode N1 of the driving transistor M1 is Vr-Vdata+V1+Vth, and the voltage on the first electrode (for example, the source electrode) of the driving transistor M1 is the first DC voltage V1.

For example, the light emitting control transistor M5 is configured to connect the second electrode of the driving transistor M1 and the anode of the light emitting element 02, so that the driving transistor M1 writes a driving current into the light emitting element 02, thereby driving the light emitting element 02 to emit light. For example, in this case, the driving transistor M1 is turned on under the control of the voltage Vr−Vdata+V1+Vth, thereby driving the light emitting element 02 to emit light.

For example, in the light emitting phase t3, the driving transistor M1 is in a saturated state. According to the saturation current formula of the driving transistor M1, the light emitting current $I_{EL}$ flowing through the driving transistor M1 can be expressed as:

$$I_{EL} = K*(V_{GS} - Vth)^2$$
$$= K*[(V_r - Vdata + V1 + Vth - V1) = Vth]^2$$
$$= K*(V_r - Vdata)^2$$

It can be seen from the above formula that the light emitting current $I_{EL}$ is no longer affected by the threshold voltage Vth of the driving transistor M1 and the first DC voltage V1 output from the first DC power terminal VDD, but only related to reference voltage signal Vr output from the reference voltage signal terminal Vref and the data signal Vdata. The data signal Vdata is directly transmitted by the data line DA and is independent of the threshold voltage Vth of the driving transistor M1, so that the problem of the threshold voltage drift of the driving transistor M1 due to the process and long-term operation can be solved. The reference voltage signal Vr is provided by the reference voltage signal terminal Vref and is independent of the power voltage drop (IR drop) of the first DC power terminal VDD, thereby solving the problem of IR drop of the display panel. In summary, the pixel circuit can ensure the accuracy of the light emitting current $I_{EL}$, eliminate the influence of the threshold voltage of the driving transistor M1 and IR drop on the light emitting current $I_{EL}$, and ensure that the light emitting element 02 works normally.

For example, in the above formula, K is constant, and K can be expressed as:

$$K=0.5\mu_n C_{ox}(W/L)$$

where $\mu_n$ is the electron mobility of the driving transistor M1, $C_{ox}$ is the unit capacitance of the gate of the driving transistor M1, W is the channel width of the driving transistor M1, and L is the channel length of the driving transistor M1.

It should be noted that the setting manners of the reset phase, the data writing phase, and the light emitting phase can be set according to actual application requirements, and the embodiments of the present disclosure do not specifically limit the setting manners of the reset phase, the data writing phase, and the light emitting phase.

It should be noted that, in the embodiments of the present disclosure, the first potential may be an active potential, and the second potential may be an inactive potential. In a case where the transistor is a P-type transistor, the active potential may be a low potential, and the inactive potential can be a high potential; and in a case where the transistor is a N-type transistor, the active potential may be a high potential, and the inactive potential can be a low potential.

For example, in a case where the voltage of the anode of the light emitting element 02 gradually increases during the light emitting phase t3, the voltage of the gate electrode N1 of the driving transistor M1 will increase accordingly due to the parasitic capacitor ΔC. For the driving transistor M1, in a case where the gate voltage of the driving transistor M1 increases, the drain voltage of the driving transistor M1 decreases, and accordingly, the luminous brightness of the light emitting element 02 changes. Therefore, in a case where the parasitic capacitors ΔC are different, the luminous brightness of the light emitting elements 02 will also be different, and the larger the parasitic capacitor ΔC, the weaker the luminous brightness.

Because the magnitude of the capacitance of the parasitic capacitor ΔC is proportional to the area of the overlap region between the orthographic projection of the anode of the light emitting element 02 on the base substrate and the orthographic projection of the gate electrode of the driving transistor M1 on the base substrate, by making the orthographic projection of the first electrode layer (i.e., the anode) of the light emitting element in each sub-pixel of second color on the base substrate overlap with the orthographic projection of the gate electrode of the driving transistor in the sub-pixel of second color on the base substrate, it can be ensured that the difference between capacitance values of the respective parasitic capacitors between the anodes of the light emitting elements and the gate electrodes of the driving transistors between respective sub-pixels of second color is small or zero. Correspondingly, the uniformity of the luminous brightness of the light emitting element in each sub-pixel of second color can be ensured, and the display effect of the display panel is improved.

For example, in some embodiments, the sub-pixel of first color C1 may be a red sub-pixel R, the two sub-pixels of second color C2 may be green sub-pixels G, and the sub-pixel of third color C3 may be a blue sub-pixel B. That is, the plurality of sub-pixels of different colors in the display panel may be arranged in the order of the red sub-pixel R, the green sub-pixel G, the blue sub-pixel B, and the green sub-pixel G (that is, the order of RGBG).

For example, an orthographic projection of the first electrode layer of the light emitting element in each sub-pixel of first color C1 on the base substrate 00 at least partially overlaps with an orthographic projection of the gate electrode of the driving transistor in each sub-pixel of first color C1 on the base substrate 00, that is, the projection overlap area between the first electrode layer in each sub-pixel of first color C1 and the gate electrode of the driving transistor in each sub-pixel of first color C1 is greater than 0, and the projection overlap areas of the respective sub-pixels of first color are equal. For example, in some examples, the orthographic projection of the gate electrode of the driving transistor in the sub-pixel of first color C1 on the base substrate 00 is located in the orthographic projection of the first electrode layer of the light emitting element in the sub-pixel of first color C1 on the base substrate 00.

For example, an orthographic projection of the first electrode layer of the light emitting element in each sub-pixel of third color C3 on the base substrate 00 also at least partially overlaps with an orthographic projection of the gate electrode of the driving transistor in each sub-pixel of third color C3 on the base substrate 00, that is, the projection overlap area between the first electrode layer and the gate electrode of the driving transistor in each sub-pixel of third color C3 is greater than 0, and the projection overlap areas of the respective sub-pixels of third color are equal. For example, in some examples, the orthographic projection of the gate electrode of the driving transistor in the sub-pixel of third color C3 on the base substrate 00 is located in the orthographic projection of the first electrode layer of the light emitting element in the sub-pixel of third color C3 on the base substrate 00.

Correspondingly, in the display panel, the parasitic capacitors between the light emitting elements in the respective sub-pixels of first color C1 and the gate electrodes of the driving transistors in the respective sub-pixels of first color C1 are the same, the parasitic capacitors between the light emitting elements in the respective sub-pixels of third color C3 and the gate electrodes of the driving transistors in the respective sub-pixels of third color C3 are the same. That is, the luminous brightness of the light emitting elements 02 in the respective sub-pixels of first color C1 in the display panel is the same, and the luminous brightness of the light emitting elements 02 in the respective sub-pixels of third color C3 is also the same.

For example, referring to FIG. 5, in two sub-pixels of first color, an orthographic projection of the anode R1 of the light emitting element in a first one of the sub-pixels of first color on the base substrate 00 at least partially overlaps with an orthographic projection of the gate electrode of the driving transistor in the pixel circuit 01 (that is, the pixel circuit in region 10) of the first one of the sub-pixels of first color on the base substrate 00; an orthographic projection of the anode R2 of the light emitting element in a second one of the sub-pixels of first color on the base substrate 00 at least partially overlaps with an orthographic projection of the gate electrode of the driving transistor in the pixel circuit 01 (that is, the pixel circuit in region 70) of the second one of the sub-pixels of first color on the base substrate 00. For example, the orthographic projection of the gate electrode of the driving transistor in the pixel circuit 01 of the first one of the sub-pixels of first color on the base substrate 00 is located in the orthographic projection of the anode R1 of the light emitting element in the first one of the sub-pixels of first color on the base substrate 00; the orthographic projection of the gate electrode of the driving transistor in the pixel circuit 01 of the second one of the sub-pixels of first color on the base substrate 00 is located in the orthographic projection of the anode R2 of the light emitting element in the second one of the sub-pixels of first color on the base substrate 00.

For example, in some examples, the area of the overlap region between the orthographic projection of the gate electrode of the driving transistor in the pixel circuit 01 of the first one of the sub-pixels of first color on the base substrate 00 and the orthographic projection of the anode of the light emitting element in the first one of the sub-pixels of first color on the base substrate 00 is the same as the area of the overlap region between the orthographic projection of the gate electrode of the driving transistor in the pixel circuit 01 of the second one of the sub-pixels of first color on the base substrate 00 and the orthographic projection of the anode of the light emitting element in the second one of the sub-pixel of first color on the base substrate 00.

For example, referring to FIG. 5, in the two sub-pixels of third color, an orthographic projection of the anode B1 of the light emitting element in a first one of the sub-pixels of third color on the base substrate 00 at least partially overlaps with an orthographic projection of the gate electrode of the driving transistor in the pixel circuit 01 (that is, the pixel circuit in region 30) of the first one of the sub-pixels of third color on the base substrate; an orthographic projection of the anode B2 of the light emitting element in a second one of the sub-pixels of third color on the base substrate 00 at least partially overlaps with an orthographic projection of the gate electrode of the driving transistor in the pixel circuit 01 (that is, the pixel circuit in region 50) of the second one of the sub-pixels of third color on the base substrate. For example, the orthographic projection of the gate electrode of the driving transistor in the pixel circuit 01 of the first one of the sub-pixels of third color on the base substrate 00 is located in the orthographic projection of the anode B1 of the light emitting element in the first one of the sub-pixels of third color on the base substrate 00; the orthographic projection of the gate electrode of the driving transistor in the pixel circuit 01 of the second one of the sub-pixels of third color on the base substrate 00 is located in the orthographic projection of the anode B2 of the light emitting element in the second one of the sub-pixels of third color on the base substrate 00.

For example, in some examples, the area of the overlap region between the orthographic projection of the gate electrode of the driving transistor in the pixel circuit 01 of the first one of the sub-pixels of third color on the base substrate 00 and the orthographic projection of the anode B1 of the light emitting element in the first one of the sub-pixels of third color on the base substrate 00 is the same as the area of the overlap region between the orthographic projection of the gate electrode of the driving transistor in the pixel circuit 01 of the second one of the sub-pixels of third color on the base substrate 00 and the orthographic projection of the anode B2 of the light emitting element in the second one of the sub-pixels of third color on the base substrate 00.

In addition, in the embodiment of the present disclosure, in two adjacent sub-pixels of second color, the orthographic projection of the first electrode layer in the first sub-pixel of second color on the base substrate 00 at least partially overlaps with the orthographic projection of the pixel circuit (that is, the pixel circuit in region 20) of the second sub-pixel of second color on the base substrate 00. The orthographic projection of the first electrode layer of the light emitting element in the second sub-pixel of second color on the base substrate 00 does not overlap with the orthographic projection of the pixel circuit (that is, the pixel circuit in region 60) of the first sub-pixel of second color on the base substrate 00.

It should be noted that, as shown in FIG. 5, the orthographic projection of the first electrode layer in the first sub-pixel of second color on the base substrate 00 also at least partially overlaps with the orthographic projection of the pixel circuit (that is, the pixel circuit in region 60) of the first sub-pixel of second color on the base substrate 00.

For example, referring to FIG. 5, in two adjacent sub-pixels of second color located in a second column, the orthographic projection of the anode G1 of the light emitting element in the first sub-pixel of second color on the base substrate 00 at least partially overlaps with the region 20 where the pixel circuit 01 of the second sub-pixel of second color is located. In addition, the orthographic projection of the anode G1 of the light emitting element in the first sub-pixel of second color on the base substrate 00 at least partially overlaps with the region 60 where the pixel circuit 01 of the first sub-pixel of second color is located. The orthographic projection of the anode G2 of the light emitting element in the second sub-pixel of second color on the base substrate 00 only overlaps with the region 20 where the pixel circuit 01 of the second sub-pixel of second color is located, and does not overlap with the region 60 where the pixel circuit 01 of the first sub-pixel of second color is located.

Figure 7:
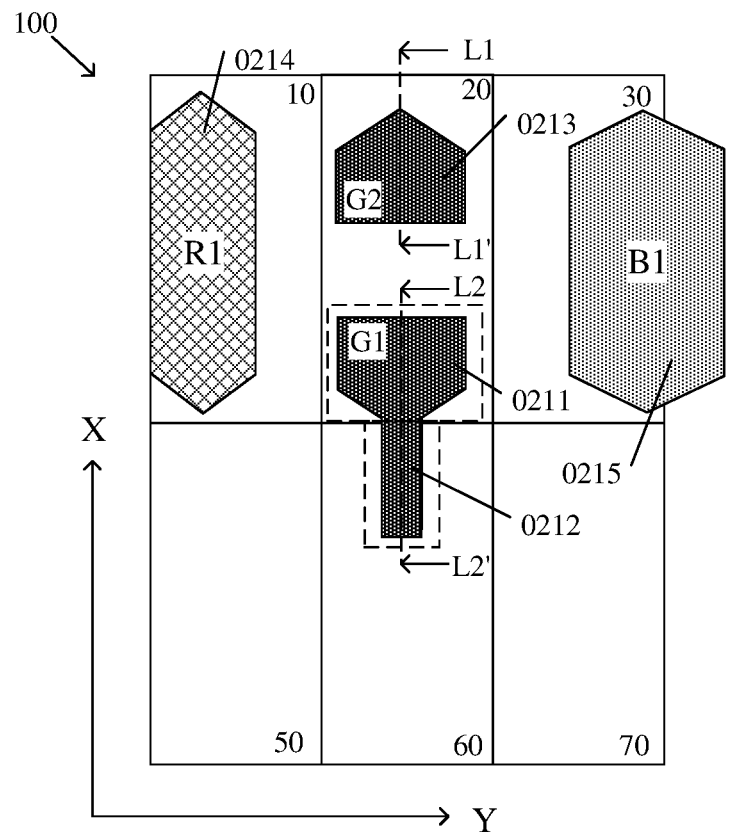
FIG. 7 is a schematic structural diagram of a repeating unit provided by some embodiments of the present disclosure.
Figure 8A:
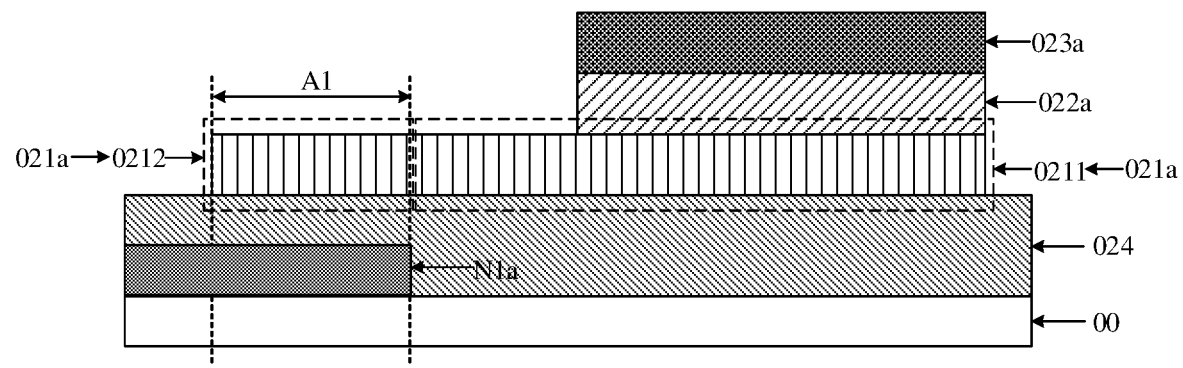
FIG. 8A is a schematic structural diagram of a first sub-pixel of second color provided by some embodiments of the present disclosure.
Figure 8B:
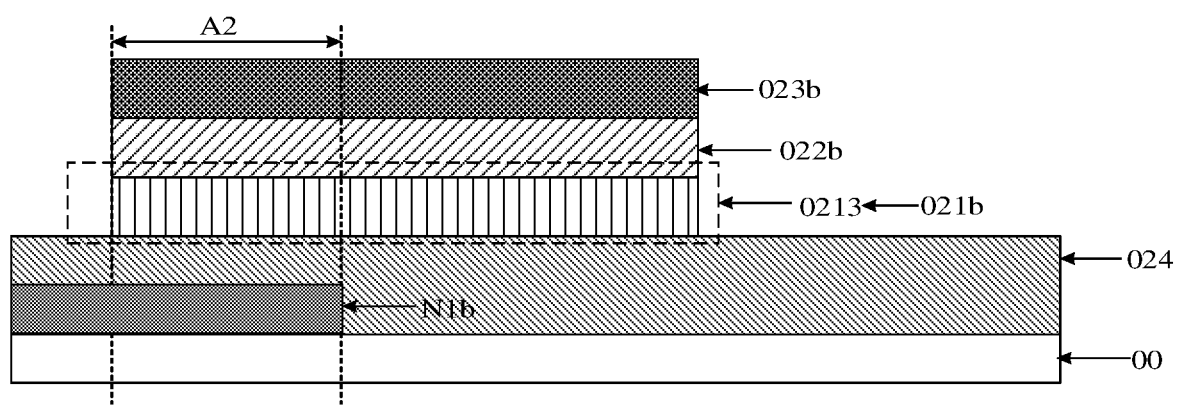
FIG. 8B is a schematic structural diagram of a second sub-pixel of second colors provided by some embodiments of the present disclosure.

FIG. 7 is a schematic structural diagram of a repeating unit provided by some embodiments of the present disclosure; FIG. 8A is a schematic diagram of a cross-sectional structure of a first sub-pixel of second color provided by some embodiments of the present disclosure; and FIG. 8B is a schematic diagram of a cross-sectional structure of a second sub-pixel of second color provided by some embodiments of the present disclosure. FIG. 8A is a schematic diagram of a cross-sectional structure taken along a line L1-L1' in FIG. 7, and FIG. 8B is a schematic diagram of a cross-sectional structure taken along a line L2-L2' in FIG. 7.

For example, referring to FIG. 7 and FIG. 8A, it can be seen that, among two adjacent sub-pixels of second color, the first electrode layer 021*a* (such as the anode G1) of the light emitting element in the first sub-pixel of second color may include: a first driving electrode block 0211 and an auxiliary electrode block 0212 connected to the first driving electrode block 0211.

For example, referring to FIG. 7, an orthographic projection of the first driving electrode block 0211 on the base substrate 00 at least partially overlaps with the region (such as region 20) where the pixel circuit 01 of the second sub-pixel of second color is located and does not overlap with the region (such as region 60) where the pixel circuit 01 of the first sub-pixel of second color is located. Referring to FIG. 7, an orthographic projection of the auxiliary electrode block 0212 on the base substrate 00 overlaps with the region (such as region 60) where the pixel circuit 01 of the first sub-pixel of second color is located. For example, the orthographic projection of the auxiliary electrode block 0212 on the base substrate 00 does not overlap with the region (such as region 20) where the pixel circuit 01 of the second sub-pixel of second color is located. And referring to FIG. 8A, the auxiliary electrode block 0212 at least partially overlaps with the orthographic projection of the gate electrode N1*a* of the driving transistor in the pixel circuit 01 (that is, the pixel circuit in the region 60) on the base substrate 00.

For example, referring to FIG. 7 and FIG. 8B, it can be seen that the orthographic projection of the first electrode layer 021*b* (such as the anode G2) of the second sub-pixel of second color on the base substrate 00 overlaps with the orthographic projection of the gate electrode N1*b* of the driving transistor in the pixel circuit 01 (i.e., the pixel circuit in the region 20) of the second sub-pixel of second color on the base substrate 00. For example, the first electrode layer 021*b* of the light emitting element in the second sub-pixel of second color includes a second driving electrode block 0213; an orthographic projection of the second driving electrode block 0213 on the base substrate 00 at least partially overlaps with the orthographic projection of the gate electrode N1*b* of the driving transistor in the second sub-pixel of second color on the base substrate 00.

For example, in the embodiments of the present disclosure, a ratio (i.e., A1/A2) of an area of a first projection overlap region A1 of the auxiliary electrode block 0212 in the first sub-pixel of second color to an area of a second projection overlap region A2 of the first electrode layer 021 in the second sub-pixel of second color is within a ratio range.

For example, as shown in FIG. 8A, the first projection overlap region A1 is an overlap region between the orthographic projection of the auxiliary electrode block 0212 on the base substrate 00 and the orthographic projection of the gate electrode N1*a* of the driving transistor in the first sub-pixel of second color on the base substrate 00. As shown in FIG. 8B, the second projection overlap region A2 is an overlap region between the orthographic projection of the first electrode layer 021b (for example, the second driving electrode block 0213) in the second sub-pixel of second color on the base substrate 00 and the orthographic projection of the gate electrode N1b of the driving transistor in the pixel circuit 01 of the second sub-pixel of second color on the base substrate 00.

For example, the ratio range is from 90% to 110%, that is, 90%≤A1/A2≤110%.

For example, the ratio range can be from 95% to 105%. By forming the display panel provided by the embodiment of the present disclosure in accordance with the ratio range, it can be ensured that in two adjacent sub-pixels of second color, a difference between the area of the overlap region between the orthographic projection of the first electrode layer in the first sub-pixel of second color on the base substrate and the orthographic projection of the gate electrode of the driving transistor in the first sub-pixel of second color on the base substrate 00 and the area of the overlap region between the orthographic projection of the first electrode layer in the second sub-pixel of second color on the base substrate and the orthographic projection of the gate electrode of the driving transistor in the second sub-pixel of second color on the base substrate is small (for example, is less than 10%). Furthermore, it can be ensured that in two adjacent sub-pixels of second color, the difference between the parasitic capacitor of the first sub-pixel of second color and the parasitic capacitor of the second sub-pixel of second color is also small (for example, less than 10%), thereby effectively ensuring the display effect of the display panel. Moreover, even under a low gray level (such as 64 gray level), that is, in a case where the human eye has high recognition ability, the user may not be able to see the brightness difference between the first sub-pixel of second color and the second sub-pixel of second color, thereby effectively improving the display effect of the display panel and enhancing the user experience.

For example, Table 1 respectively shows the parasitic capacitors of the two adjacent sub-pixels of second color located in the same column in the comparative example shown in FIG. 1 and the parasitic capacitors (the parasitic capacitor is the capacitor between the first electrode layer of the light emitting element and the gate electrode of the driving transistor in the sub-pixel of second color) of the two adjacent sub-pixels of second color located in the same column in the embodiment provided by the present disclosure, the luminous brightness of the light emitting elements in the two sub-pixels of second color and a ratio of a luminous brightness difference.

TABLE 1

| light emitting element | the comparative example shown in FIG. 1 | | the embodiment of the present disclosure | |
|---|---|---|---|---|
| | parasitic capacitor | luminous brightness | parasitic capacitor | luminous brightness |
| 21/G2 | C11 | 120 | C11 | 120 |
| 61/G1 | 0 | 80 | C11 | 117.4 |
| luminous brightness difference | | 30% | | 2.17% |

Referring to FIG. 1, it can be seen that, in the comparative example shown in FIG. 1, in the two adjacent sub-pixels of second color located in the same column, the capacitance of the parasitic capacitor between the anode 21 of the light emitting element in the first sub-pixel of second color and the gate electrode of the driving transistor in the pixel circuit 01 (i.e., the pixel circuit in the region 20) of the first sub-pixel of second color is C11, and the luminous brightness of the light emitting element in the first sub-pixel of second color is 120. The capacitance of the parasitic capacitor between the anode 61 of the light emitting element in the second sub-pixel of second color and the gate electrode of the driving transistor in the pixel circuit 01 (i.e., the pixel circuit in the region 60) of the second sub-pixel of second color is 0, and the luminous brightness of the light emitting element in the second sub-pixel of second color is 80. The ratio of the luminous brightness difference between the two light emitting elements is 30%.

For example, referring to FIG. 1, it can be seen that, in the embodiment of the present disclosure, in the two adjacent sub-pixels of second color located in the same column, the capacitance of the parasitic capacitor between the anode G2 of the light emitting element in the second sub-pixel of second color and the gate electrode N1b of the driving transistor in the pixel circuit 01 (i.e., the pixel circuit in the region 20) of the second sub-pixel of second color is C11, and the luminous brightness of the light emitting element in the second sub-pixel of second color is 120. The capacitance of the parasitic capacitor between the anode G1 of the light emitting element in the first sub-pixel of second color and the gate electrode N1a of the driving transistor in the pixel circuit 01 (i.e., the pixel circuit in the region 60) of the first sub-pixel of second color is C11, and the luminous brightness of the light emitting element in the first sub-pixel of second color is 117.4. The ratio of the luminous brightness difference between the two light emitting elements is 2.17%. That is, the luminous brightness difference of the light emitting elements in two adjacent sub-pixels of second color in the display panel provided by the embodiment of the present disclosure is smaller.

For example, in the embodiments of the present disclosure, the parasitic capacitor ΔC of each sub-pixel of second color is the capacitor between the gate electrode of the driving transistor and the anode of the light emitting element in the sub-pixel of second color, and the value of C11 is 2.5 fF to 4 fF.

For example, the parasitic sub-circuit of the pixel circuit in the first sub-pixel of second color includes a first capacitor, the first capacitor includes a first electrode and a second electrode, the auxiliary electrode block 0212 is used as the first electrode of the first capacitor, and the gate electrode N1a of the driving transistor of the first sub-pixel of second color is multiplexed as the second electrode of the first capacitor. That is, the auxiliary electrode block 0212 is the first electrode of the first capacitor, and the gate electrode N1a of the driving transistor of the first sub-pixel of second color is the second electrode of the first capacitor.

For example, the parasitic sub-circuit of the pixel circuit in the second sub-pixel of second color includes a second capacitor, the second capacitor includes a first electrode and a second electrode, and the second driving electrode block 0213 is multiplexed as the first electrode of the second capacitor, and the gate electrode N1b of the driving transistor of the second sub-pixel of second color is multiplexed as the second electrode of the second capacitor. That is, the second driving electrode block 0213 is the first electrode of the second capacitor, and the gate electrode N1b of the driving transistor of the second sub-pixel of second color is the second electrode of the second capacitor.

It should be noted that the first capacitor is the parasitic capacitor between the gate electrode of the driving transistor of the first sub-pixel of second color and the anode of the light emitting element of the first sub-pixel of second color, and the second capacitor is the parasitic capacitor between the gate electrode of the driving transistor of the second sub-pixel of second color and the anode of the light emitting element of the second sub-pixel of second color.

For example, a capacitance value of the first capacitor and a capacitance value of the second capacitor can be the same, so that the pixel brightness of the first sub-pixel of second color and the pixel brightness of the second sub-pixel of second color can be uniform, thereby improving the display uniformity and the display effect.

For example, as shown in FIGS. 8A and 8B, the display panel may further include a flat layer 024 disposed on a side of the driving transistor of the pixel circuit away from the base substrate 00. Accordingly, referring to FIG. 8A, the first electrode layer 021*a* of the first sub-pixel of second color may be disposed on a side of the flat layer 024 away from the driving transistor. The light emitting layer 022*a* of the first sub-pixel of second color may be disposed on a side of the first electrode layer 021*a* away from the flat layer 024. The second electrode layer 023*a* of the first sub-pixel of second color may be disposed on a side of the light emitting layer 022*a* away from the first electrode layer 021*a*. Referring to FIG. 8B, the first electrode layer 021*b* of the second sub-pixel of second color may be disposed on a side of the flat layer 024 away from the driving transistor. The light emitting layer 022*b* of the second sub-pixel of second color may be disposed on a side of the first electrode layer 021*b* away from the flat layer 024. The second electrode layer 023*b* of the second sub-pixel of second color may be disposed on a side of the light emitting layer 022*b* away from the first electrode layer 021*b*.

For example, the area of the first electrode layer of each sub-pixel may be specifically designed according to the luminous efficiency of the light emitting material. For example, the luminous efficiency of the light emitting material is higher, the area of the first electrode layer of the sub-pixel may be smaller; however the luminous efficiency of the light emitting material is lower, the area of the first electrode layer of the sub-pixel can be larger. Referring to FIG. 5, in some embodiments of the present disclosure, the area of the orthographic projection of the first electrode layer (such as anode R1) in the sub-pixel of first color on the base substrate 00 is larger than the area of the orthographic projection of the first electrode layer (such as any one of the anode G1 and the anode G2) in the sub-pixel of second color and is smaller than the area of the orthographic projection of the first electrode layer (such as anode B1) in the sub-pixel of third color on the base substrate 00.

For example, referring to FIG. 5, a shape of the orthographic projection of the first electrode layer 021 (such as the anode R1) in the sub-pixel of first color on the base substrate 00 and a shape of the orthographic projection of the first electrode layer 021 (such as the anode) in the sub-pixel of third color B1 on the base substrate 00 both may be hexagons. It should be noted that, for the sub-pixel of first color, a portion where the planar second electrode layer overlaps with the first electrode layer of the light emitting element of the sub-pixel of first color may be represented as the second electrode layer of the light emitting element of the sub-pixel of first color; for the sub-pixel of third color, a portion where the planar second electrode layer overlaps with the first electrode layer of the light emitting element of the sub-pixel of third color be represented as the second electrode layer of the light emitting element of the sub-pixel of third color. That is, the second electrode layer of the light emitting element of the sub-pixel of first color, the second electrode layer of the light emitting element of the first sub-pixel of second color, the second electrode layer of the light emitting element of the second sub-pixel of second color, and the second electrode layer of the light emitting element of the sub-pixel of third color are integrated as a whole.

For example, as shown in FIG. 7, in the two adjacent sub-pixels of second color, for example, the shape of the anode G1 of the first electrode layer of the light emitting element in the first sub-pixel of second color is different from the shape of, for example, the anode G2 of the first electrode layer of the light emitting element in the second sub-pixel of second color. For example, the shape of the orthographic projection of the first electrode layer (such as the anode G2) in the second sub-pixel of second color on the base substrate 00 is a pentagon, and the pentagon may be composed of a triangle and a rectangle. The shape of the orthographic projection of the first electrode layer (such as anode G1) in the first sub-pixel of second color on the base substrate 00 is an irregular octagon, and the octagon may be composed of a pentagon and a rectangle.

For example, in some embodiments, the shape of the first driving electrode block 0211 is the same as the shape of the second driving electrode block 0213, and the area of the orthographic projection of the first driving electrode block 0211 on the base substrate 00 is the same as the area of the orthographic projection of the second driving electrode block 0213 on the base substrate 00. For example, as shown in FIG. 7, the shape of the first driving electrode block 0211 and the shape of the second driving electrode block 0213 may both be pentagon, and the shape of the orthographic projection of the first driving electrode block 0211 on the base substrate 00 is the same as the shape of the first driving electrode block 0211, that is, is also a pentagon; the shape of the orthographic projection of the second driving electrode block 0213 on the base substrate 00 is the same as the shape of the second driving electrode block 0213, that is, is also a pentagon.

It should be noted that, in some embodiments, the shape of the first driving electrode block 0211 and the shape of the second driving electrode block 0213 may also be rectangles, rhombuses, or the like. The shape of the first driving electrode block 0211 and the shape of the second driving electrode block 0213 may also be different, and the present disclosure is not limited thereto.

For example, as shown in FIG. 7, the shape of the auxiliary electrode block 0212 may be a rectangle, and the shape of the orthographic projection of the auxiliary electrode block 0212 on the base substrate 00 is the same as the shape of the auxiliary electrode block 0212, that is, is also a rectangle. However, the present disclosure is not limited thereto, and the shape of the auxiliary electrode block 0212 may also be a pentagon, a hexagon, an ellipse, or the like.

For example, the gate electrode of the driving transistor of the pixel circuit of the first sub-pixel of second color and the gate electrode of the driving transistor of the pixel circuit of the second sub-pixel of second color are arranged in a first direction X. The first direction X is parallel to the surface of the base substrate 00.

For example, in the first direction X, the first driving electrode block 0211 is located on a side of the gate electrode of the driving transistor of the pixel circuit in the first sub-pixel of second color close to the gate electrode of the driving transistor of the pixel circuit in the second sub-pixel of second color. For example, in the first direction X, the first driving electrode block 0211 is located between the gate electrode of the driving transistor of the pixel circuit of the first sub-pixel of second color and the gate electrode of the driving transistor of the pixel circuit of the second sub-pixel of second color.

For example, a distance between a center of the gate electrode of the driving transistor of the pixel circuit of the first sub-pixel of second color and a center of the first driving electrode block 0211 is greater than a distance between a center of the gate electrode of the driving transistor of the pixel circuit of the second sub-pixel of second color and a center of the second driving electrode block 0213.

It should be noted that, in the present disclosure, "center" may represent a geometric center of a physical shape of an element. When designing the pixel arrangement structure, elements, such as the gate electrode of the driving transistor and the anode of the light emitting element, are generally designed to have regular shapes, such as a rectangle, a hexagon, a pentagon, a trapezoid, or other shapes. When designing, a center of an element (for example, the gate electrode of the driving transistor or the anode of the light emitting element, etc.) may be a geometric center of the regular shape described above. However, in the actual manufacturing process, shapes of the elements, such as the gate electrode of the driving transistor and the anode of the light emitting element, which are formed, generally deviate from the regular shapes designed above. For example, respective corners of the above-mentioned regular shapes may be rounded, so the shapes of the elements, such as the gate electrode of the driving transistor, the anode of the light emitting element, etc., may be fillet shapes. In addition, the shapes of the elements, such as the gate electrode of the driving transistor and the anode of the light emitting element, which are actually manufactured, may also have other changes with the designed shapes. For example, the shape of a sub-pixel designed as a hexagon may become approximately ellipse shape in an actual manufacturing process. Therefore, the centers of the elements, such as the gate electrode of the driving transistor and the anode of the light emitting element, may not be the strict geometric centers of the irregular shapes of the formed sub-pixels. In the embodiments of the present disclosure, the center of the element may have a certain offset from the geometric center of the shape of the element. In addition, "center" can also represent the center of gravity of the element.

For example, the first electrode layer (such as anode R1) of the light emitting element of the sub-pixel of first color may include a third driving electrode block, and the first electrode layer (such as anode B1) of the light emitting element of the sub-pixel of third color includes a fourth driving electrode block. For example, the orthographic projection of the gate electrode of the driving transistor of the pixel circuit of the sub-pixel of first color on the base substrate 00 at least partially overlaps with the orthographic projection of the third driving electrode block on the base substrate 00; and the orthographic projection of the gate electrode of the driving transistor of the pixel circuit of the sub-pixel of third color on the base substrate 00 at least partially overlaps with the orthographic projection of the fourth driving electrode block on the base substrate 00.

For example, the parasitic sub-circuit of the pixel circuit in the sub-pixel of first color includes a third capacitor, the third capacitor includes a first electrode and a second electrode, and the third driving electrode block is multiplexed as the first electrode of the third capacitor, and the gate electrode of the driving transistor of the sub-pixel of first color is multiplexed as the second electrode of the third capacitor.

For example, the parasitic sub-circuit of the pixel circuit in the sub-pixel of third color includes a fourth capacitor, the fourth capacitor includes a first electrode and a second electrode, the fourth driving electrode block is multiplexed as the first electrode of the fourth capacitor, and the gate electrode of the driving transistor of the sub-pixel of third color is multiplexed as the second electrode of the fourth capacitor.

For example, a shape of the third driving electrode block may be a regular hexagon, and a shape of the fourth driving electrode block may also be a regular hexagon. For example, in some embodiments, the shape of the third driving electrode block and the shape of the fourth driving electrode block may also be rectangles or long ellipses. The present disclosure does not specifically limit the shape of the third driving electrode block and the shape of the fourth driving electrode block.

It should be noted that the shape of the first electrode layer and the shape of the orthographic projection of the first electrode layer in the sub-pixel of first color on the base substrate 00, the shape of the first electrode layer and the shape of the orthographic projection of the first electrode layer in the sub-pixel of second color on the base substrate, and the shape of the first electrode layer and the shape of the orthographic projection of the first electrode layer in the sub-pixel of third color on the base substrate 00 may also be other shapes (such as circle), and the embodiments of the present disclosure is not limited thereto.

For example, in the example shown in 7, the first driving electrode block 0211 and the auxiliary electrode block 0212 are provided integrally. It should be noted that, in other examples, the first driving electrode block 0211 and the auxiliary electrode block 0212 may be separately provided, as long as the first driving electrode block 0211 and the auxiliary electrode block 0212 can be electrically connected to each other.

For example, the first driving electrode block 0211 and the auxiliary electrode block 0212 may be formed at the same time by the same patterning process.

For example, the shape of the first driving electrode block 0211 and the shape of the auxiliary electrode block 0212 are different.

For example, the area of the orthographic projection of the first electrode layer 021*a* of the light emitting element in the first sub-pixel of second color C2 on the base substrate 00 is different from the area of the orthographic projection of the first electrode layer 021*b* of the light emitting element in the second sub-pixel of second color C2 on the base substrate, and the area of the orthographic projection of the first electrode layer 021*a* of the light emitting element in the first sub-pixel of second color C2 on the base substrate 00 is larger than the area of the orthographic projection of the first electrode layer 021*b* of the light emitting element in the second sub-pixel of second color C2 on the base substrate 00.

For example, as shown in FIG. 8A, the orthographic projection of the first driving electrode block 0211 on the base substrate 00, the orthographic projection of the light emitting layer 022*a* of the light emitting element of the first sub-pixel of second color on the base substrate 00, and the orthographic projection of the second electrode layer 023*a* of the light emitting element of the first sub-pixel of second color on the base substrate 00 at least partially overlap. For example, the orthographic projection of the first driving electrode block 0211 on the base substrate 00 is located in the orthographic projection of the second electrode layer 023*a* of the light emitting element of the first sub-pixel of second color C1 on the base substrate 00, and the orthographic projection of the light emitting layer 022*a* of the light emitting element of the first sub-pixel of second color C1 on the base substrate 00 may also be located in the orthographic projection of the second electrode layer 023*a* of the light emitting element of the first sub-pixel of second color C1 on the base substrate 00.

For example, as shown in FIG. 8B, the orthographic projection of the second driving electrode block 0213 on the base substrate 00, the orthographic projection of the light emitting layer 022*b* of the light emitting element of the second sub-pixel of second color on the base substrate 00, and the orthographic projection of the second electrode layers 023*b* of the light emitting element of the second sub-pixel of second color on the base substrate 00 at least partially overlap. For example, the orthographic projection of the second driving electrode block 0213 on the base substrate 00 is located in the orthographic projection of the second electrode layer 023*b* of the light emitting element of the second sub-pixel of second color on the base substrate 10, and the orthographic projection of the light emitting layer 022*b* of the light emitting element of the second sub-pixel of second color C2 on the base substrate 00 may also be located in the orthographic projection of the second electrode layer 023*b* of the light emitting element of the second sub-pixel of second color C2 on the base substrate 00. For example, as shown in FIG. 5 and FIG. 7, in each repeating unit 100, the first sub-pixel of second color and the second sub-pixel of second color are arranged along a first direction X, and the first direction X is parallel to the surface of the base substrate 00. For example, as shown in FIG. 5 and FIG. 7, in each repeating unit 100, the sub-pixel of first color and the sub-pixel of third color are arranged along the second direction Y, in the second direction Y, the first sub-pixel of second color and the second sub-pixel of second color are located between the sub-pixel of first color and the sub-pixel of third color, the second direction Y is parallel to the surface of the base substrate 00, and the first direction X and the second direction Y are perpendicular to each other.

For example, in the first direction X, the auxiliary electrode block 0212 is located on the side of the first driving electrode block 0211 away from the light emitting element, such as the anode G2, of the second sub-pixel of second color, that is, as shown in FIG. 7, in the first direction X, the first driving electrode block 0211 is located between the auxiliary electrode block 0212 and the second driving electrode block 0213.

For example, as shown in FIG. 5 and FIG. 7, in some embodiments, in each repeating unit 100, a line connecting the center of the first sub-pixel of second color and the center of the second sub-pixel of second color is a first center line, and a line connecting the center of the sub-pixel of first color R1 and the center of the sub-pixel of third color B1 is a second center line. A length of the first center line is shorter than a length of the second center line. For example, the first center line and the second center line are perpendicular to each other and bisected by each other, the first center line is substantially parallel to the first direction X, and the second center line is substantially parallel to the second direction Y.

Figure 9A:
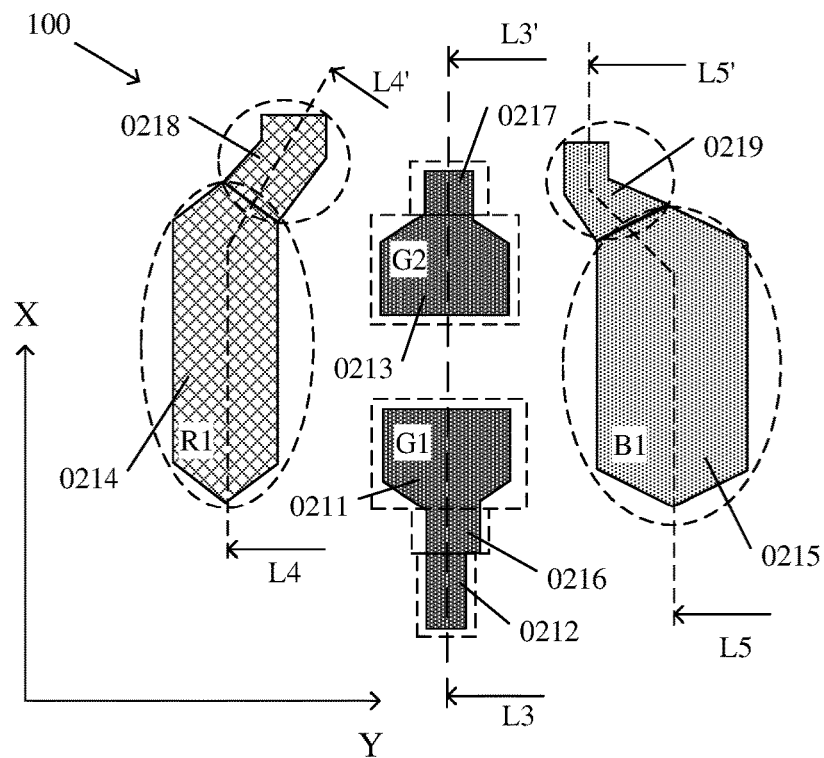
FIG. 9A is a plane structural diagram of a repeating unit provided by some other embodiments of the present disclosure.
Figure 9B:
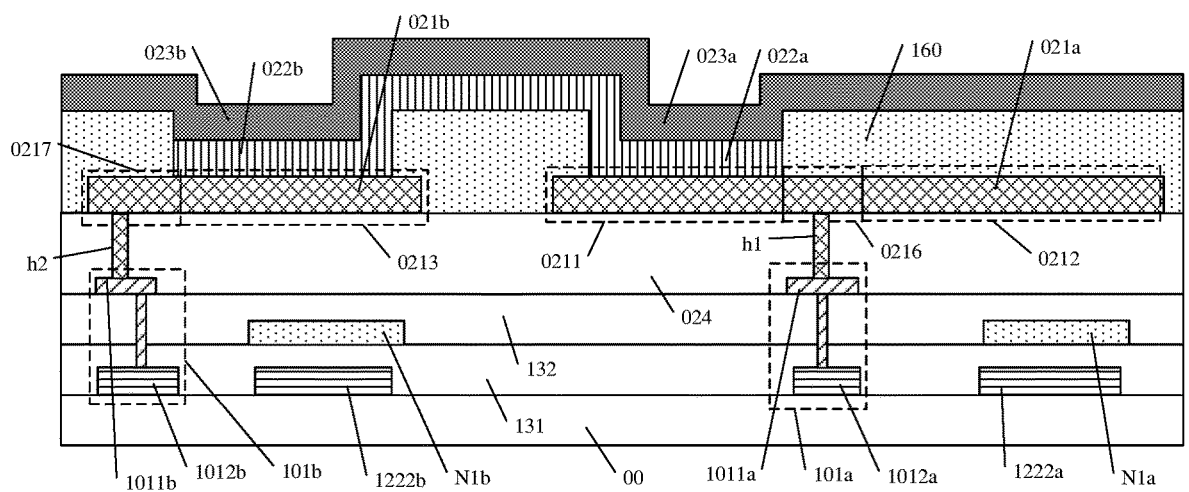
FIG. 9B is a schematic cross-sectional structure diagram of a line L3-L3' in FIG. 9A.
Figure 9C:
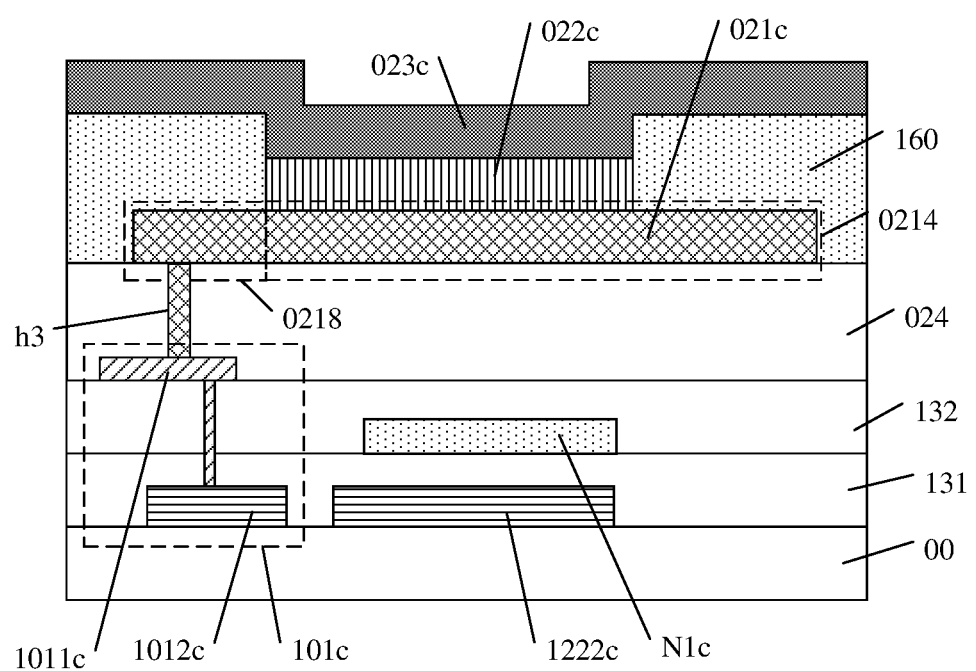
FIG. 9C is a schematic cross-sectional structure diagram of a line L4-L4' in FIG. 9A.
Figure 9D:
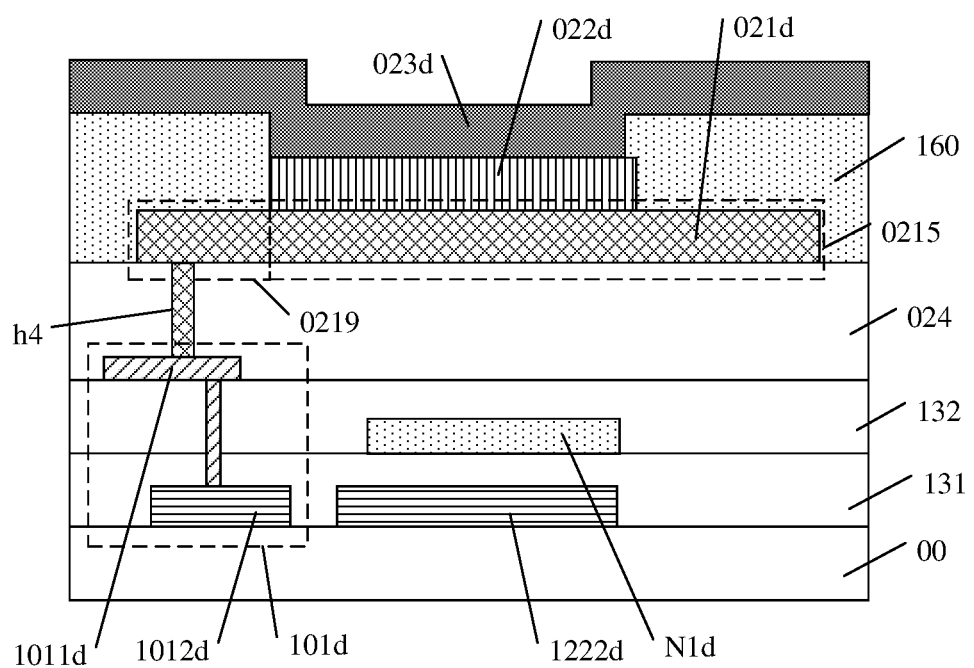
FIG. 9D is a schematic cross-sectional structure diagram of a line L5-L5' in FIG. 9A.

FIG. 9A is a plane structural diagram of a repeating unit provided by some other embodiments of the present disclosure; FIG. 9B is a schematic cross-sectional structure diagram of a line L3-L3' in FIG. 9A; FIG. 9C is a schematic cross-sectional structure diagram of a line L4-L4' in FIG. 9A; FIG. 9D is a schematic cross-sectional structure diagram of a line L5-L5' in FIG. 9A.

For example, as shown in FIG. 9A and FIG. 9B, the first electrode layer 021*a* of the light emitting element of the first sub-pixel of second color further includes a first connection electrode block 0216. In the first direction X, the first connection electrode block 0216 is located on a side of the first driving electrode block 0211 away from the anode G2 of the light emitting element of the second sub-pixel of second color, and the first connection electrode block 0216 is located between the auxiliary electrode block 0212 and the first driving electrode block 0211, and is electrically connected to both the auxiliary electrode block 0212 and the first driving electrode block 0211.

For example, in the first direction X, the first connection electrode block 0216 is located on a side of the first driving electrode block 0211 away from the gate electrode of the driving transistor of the pixel circuit of the second sub-pixel of second color. For example, in the first direction X, the first connection electrode block 0216 is located between the gate electrode of the driving transistor of the pixel circuit of the first sub-pixel of second color and the gate electrode of the driving transistor of the pixel circuit of the second sub-pixel of second color.

For example, in some embodiments, the first connection electrode block 0216, the auxiliary electrode block 0212, and the first driving electrode block 0211 are all provided integrally. It should be noted that, in other examples, the first connection electrode block 0216, the auxiliary electrode block 0212, and the first driving electrode block 0211 may be separately provided, as long as the first connection electrode block 0216, the auxiliary electrode block 0212, and the first driving electrode block 0211 can be electrically connected to each other.

For example, the first connection electrode block 0216 is used to connect the first driving electrode block 0211 to the pixel circuit of the first sub-pixel of second color.

For example, as shown in FIG. 9B, the first connection electrode block 0216, the auxiliary electrode block 0212, and the first driving electrode block 0211 are located on the same layer.

For example, a shape of the first connection electrode block 0216 may be a regular shape, for example, a rectangle, a rhombus, etc.; while the shape of the first connection electrode block 0216 may also be an irregular shape.

For example, as shown in FIG. 9A, in some examples, the shape of the auxiliary electrode block 0212 and the shape of the first connection electrode block 0216 are both rectangles, and in the second direction Y, the width of the auxiliary electrode block 0212 is smaller than the width of the first connection electrode block 0216, that is, the auxiliary electrode block 0212 and the first connection electrode block 0216 form a step shape. In the second direction Y, the width of the first connection electrode block 0216 is smaller than the maximum width of the first driving electrode block 0211.

For example, the first driving electrode block 0211 has five internal angles, and the five internal angles may include two right angles, two obtuse angles, and an acute angle. The first connection electrode block 0216 extends from the side where the acute angle of the first driving electrode block 0211 is located and along the direction of the first driving electrode block 0211 away from the light emitting element of the second sub-pixel of second color.

For example, in some embodiments, the orthographic projection of the first connection electrode block 0216 on the base substrate 00 and the orthographic projection of the light emitting layer 022a of the light emitting element of the first sub-pixel of second color on the base substrate 00 do not overlap, and the orthographic projection of the first connection electrode block 0216 on the base substrate 00 and the orthographic projection of the gate electrode N1a of the driving transistor of the pixel circuit of the first sub-pixel of second color on the base substrate 00 do not overlap. However, the present disclosure is not limited thereto, the orthographic projection of the first connection electrode block 0216 on the base substrate 00 can also partially overlap with the orthographic projection of the gate electrode N1a of the driving transistor of the pixel circuit of the first sub-pixel of second color on the base substrate 00. It should be noted that in a case where the orthographic projection of the first connection electrode block 0216 on the base substrate 00 partially overlaps with the orthographic projection of the gate electrode N1a of the driving transistor of the pixel circuit of the first sub-pixel of second color on the base substrate 00, the area of the overlap portion between the orthographic projection of the first connection electrode block 0216 on the base substrate 00 and the orthographic projection of the gate electrode N1a of the driving transistor of the pixel circuit of the first sub-pixel of second color on the base substrate 00 is smaller than the area of the overlap portion between the orthographic projection of the auxiliary electrode block 0212 on the base substrate 00 and the orthographic projection of the gate electrode N1a of the driving transistor of the pixel circuit of the first sub-pixel of second color on the base substrate 00.

For example, as shown in FIG. 9B, the flat layer 024 may include a first hole h1. The first connection electrode block 0216 extends to the first hole h1 and is electrically connected to the light emitting control circuit 101a of the pixel circuit of the first sub-pixel of second color through the first hole h1. For example, the first connection electrode block 0216 may cover and fill the first hole h1.

For example, the pixel circuit 01 may include an active semiconductor layer, a gate metal layer, and a source/drain metal layer. In a direction perpendicular to the base substrate 00, the active semiconductor layer is located between the base substrate 00 and the gate metal layer, and the gate metal layer is located between the active semiconductor layer and the source/drain metal layer.

For example, the first connection electrode block 0216 extends to the source/drain metal layer of the pixel circuit through the first hole h1.

For example, as shown in FIG. 9A and FIG. 9B, the first electrode layer 021b of the light emitting element in the second sub-pixel of second color further includes a second connection electrode block 0217, and the second connection electrode block 0217 is electrically connected to the second driving electrode block 0213. For example, in some embodiments, the second connection electrode block 0217 is provided integrally with the second driving electrode block 0213. It should be noted that, in other examples, the second connection electrode block 0217 and the second driving electrode block 0213 may be separately provided, as long as the second connection electrode block 0217 and the second driving electrode block 0213 can be electrically connected to each other.

For example, the second connection electrode block 0217 is used to connect the second driving electrode block 0213 and the pixel circuit of the second sub-pixel of second color.

For example, as shown in FIG. 9A, in the first direction X, the second connection electrode block 0217 is located on a side of the second driving electrode block 0213 away from, for example, the anode G1 of the light emitting element of the first sub-pixel of second color, that is, in the first direction X, the second driving electrode block 0213 is located between the second connection electrode block 0217 and the first driving electrode block 0211.

For example, in the first direction X, the second connection electrode block 0217 is located on a side of the gate electrode of the driving transistor of the pixel circuit of the second sub-pixel of second color away from the gate electrode of the driving transistor of the pixel circuit of the first sub-pixel of second color.

For example, as shown in FIG. 9B, the second connection electrode block 0217 and the second driving electrode block 0213 are located on the same layer.

For example, the shape of the second connection electrode block 0217 may be a regular shape, for example, a rectangle, rhombus, etc.; while the shape of the second connection electrode block 0217 may also be an irregular shape.

For example, in some examples, in the second direction Y, the width of the second connection electrode block 0217 is smaller than the maximum width of the second driving electrode block 0213. For example, the second driving electrode block 0213 has five internal angles, and the five internal angles may include two right angles, two obtuse angles, and an acute angle. The second connection electrode block 0217 extends from the side where the acute angle of the second driving electrode block 0213 is located and along a direction of the second driving electrode block 0213 away from the light emitting element of the first sub-pixel of second color.

For example, in some examples, the shape of the first connection electrode block 0216 and the shape of the second connection electrode block 0217 may be the same, and the area of the orthographic projection of the first connection electrode block 0216 on the base substrate 00 is the same as the area of the orthographic projection of the second connection electrode block 0217 on the base substrate 00.

For example, in some embodiments, the orthographic projection of the second connection electrode block 0217 on the base substrate 00 and the orthographic projection of the light emitting layer 022b of the light emitting element of the second sub-pixel of second color on the base substrate 00 do not overlap, and the orthographic projection of the second connection electrode block 0217 on the base substrate 00 and the orthographic projection of the gate electrode N1b of the driving transistor of the pixel circuit of the second sub-pixel of second color on the base substrate 00 do not overlap. However, the present disclosure is not limited thereto, the orthographic projection of the second connection electrode block 0217 on the base substrate 00 may also partially overlaps with the orthographic projection of the gate electrode N1b of the driving transistor of the pixel circuit of the second sub-pixel of second color on the base substrate 00. It should be noted that in a case where the orthographic projection of the second connection electrode block 0217 on the base substrate 00 partially overlaps with the orthographic projection of the gate electrode N1b of the driving transistor of the pixel circuit of the second sub-pixel of second color on the base substrate 00, the area of the overlap portion between the orthographic projection of the second connection electrode block 0217 on the base substrate 00 and the orthographic projection of the gate electrode N1b of the driving transistor of the pixel circuit of the second sub-pixel of second color on the base substrate 00 is smaller than the area of the overlap portion between the orthographic projection of the second driving electrode block 0213 on the base substrate 00 and the orthographic projection of the gate electrode N1b of the driving transistor of the pixel circuit of the second sub-pixel of second color on the base substrate 00.

For example, as shown in FIG. 9B, the flat layer 024 further includes a second hole h2. The second connection electrode block 0217 extends to the second hole h2 and is electrically connected to the light emitting control circuit 101b of the pixel circuit of the second sub-pixel of second color through the second hole h2. For example, the second connection electrode block 0217 may cover and fill the second hole h2.

For example, the second connection electrode block 0217 extends to the source/drain metal layer of the pixel circuit through the second hole h2.

For example, in some embodiments, the second electrode layers of the light emitting elements of all the sub-pixels on the display panel are provided integrally, that is, the second electrode layer entirely covers the entire base substrate 00, namely the second electrode layer may be a planar electrode. For example, as shown in FIG. 9B, for the first sub-pixel of second color and the second sub-pixel of second color, a portion where the planar second electrode layer overlaps with the first electrode layer 021a of the light emitting element of the first sub-pixel of second color may be represented as the second electrode layer 023a of the light emitting element of the first sub-pixel of second color, and a portion where the planar second electrode layer overlaps with the first electrode layer 021b of the light emitting element of the second sub-pixel of second color may be represented as the second electrode layer 023b of the light emitting element of the second sub-pixel of second color. The second electrode layer 023a of the light emitting element of the first sub-pixel of second color and the second electrode layer 023b of the light emitting element of the second sub-pixel of second color are integrally provided.

For example, as shown in FIG. 9B, the light emitting layer 022a of the light emitting element of the first sub-pixel of second color and the light emitting layer 022b of the light emitting element of the second sub-pixel of second color are integrally provided. For the first sub-pixel of second color and the second sub-pixel of second color, a portion where the integrally provided light emitting layer overlaps with the first electrode layer 021a of the light emitting element of the first sub-pixel of second color can be represented as the light emitting layer 022a of the light emitting element of the first sub-pixel of second color, and a portion where the integrally provided light emitting layer overlaps with the first electrode layer 021b of the light emitting element of the second sub-pixel of second color can be represented as the light emitting layer 022b of the light emitting element of the second sub-pixel of second color.

For example, as shown in FIG. 9B, the display panel further includes a pixel defining layer 160. The pixel defining layer 160 is located on a side of the first electrode layer of the light emitting element of each sub-pixel away from the base substrate 00 and includes a first opening, the first opening exposes a portion of the first electrode layer 021a of the light emitting element of the first sub-pixel of second color and a portion of the first electrode layer 021b of the light emitting element of the second sub-pixel of second color, at least a portion of the light emitting layer 022a of the light emitting element of the first sub-pixel of second color and at least a portion of the light emitting layer 022b of the light emitting element of the second sub-pixel of second color are located in the first opening and cover the exposed portion of the first electrode layer 021a and the exposed portion of the first electrode layer 021b, the region where the first opening overlaps with the first electrode layer 021a is the effective light emitting region of the first sub-pixel of second color, and the region where the first opening overlaps with the first electrode layer 021b is the effective light emitting region of the second sub-pixel of second color.

It should be noted that, in the embodiments of the present disclosure, the light emitting layer of each light emitting element may include the electroluminescent layer and other common layers on both sides of the electroluminescent layer, and the common layers comprises a hole injection layer, a hole transport layer, an electron injection layer, an electron transport layer, and the like, however, in the drawings of the present disclosure, only the electroluminescent layer in the light emitting layer is shown, and other common layers are not shown.

For example, as shown in FIG. 9C, the light emitting element of the sub-pixel of first color R1 includes a first electrode layer 021c, a second electrode layer 023c, and a light emitting layer 022c. As shown in FIG. 9D, the light emitting element of the sub-pixel of third color B1 includes a first electrode layer 021d, a second electrode layer 023d, and a light emitting layer 022d.

For example, an orthographic projection of the first electrode layer 021c of the light emitting element of the sub-pixel of first color R1 on the substrate 00 also at least partially overlaps with an orthographic projection of the gate electrode N1c of the driving transistor of the pixel circuit of the sub-pixel of first color R1 on the base substrate 00. For example, as shown in FIG. 9C, the orthographic projection of the gate electrode N1c of the driving transistor of the pixel circuit of the sub-pixel of first color R1 on the base substrate 00 is located within the orthographic projection of the first electrode layer 021c of the light emitting element in the sub-pixel of first color R1 on the base substrate 00.

For example, an orthographic projection of the first electrode layer 021d of the light emitting element of the sub-pixel of third color B1 on the base substrate 00 also at least partially overlaps with an orthographic projection of the gate electrode N1d of the driving transistor of the pixel circuit of the sub-pixel of third color B1 on the base substrate 00. For example, as shown in FIG. 9D, the orthographic projection of the gate electrode N1d of the driving transistor of the pixel circuit of the sub-pixel of third color B1 on the base substrate 00 is located within the orthographic projection of the first electrode layer 021d of the light emitting element of the sub-pixel of third color B1 on the base substrate 00.

For example, as shown in FIG. 9A, the first electrode layer 021c of the light emitting element of the sub-pixel of first color R1 further includes a third connection electrode block 0218 electrically connected to the third driving electrode block 0214, and the first electrode layer 021d of the light emitting element of the sub-pixel of third color B1 further includes a fourth connection electrode block 0219 electrically connected to the fourth driving electrode block 0215. For example, as shown in FIG. 9C, the orthographic projection of the gate electrode N1c of the driving transistor of the pixel circuit of the sub-pixel of first color R1 on the base substrate 00 is located within the orthographic projection of the third driving electrode block 0214 on the base substrate 00; as shown in FIG. 9D, the orthographic projection of the gate electrode N1d of the driving transistor of the pixel circuit of the sub-pixel of third color B1 on the base substrate 00 is located within the orthographic projection of the fourth driving electrode block 0215 on the base substrate 00.

For example, the third connection electrode block 0218 is used to connect the third driving electrode block 0214 and the pixel circuit of the sub-pixel of first color R1; the fourth connection electrode block 0219 is used to connect the fourth driving electrode block 0215 and the pixel circuit of the sub-pixel of third color B1.

For example, the shape of the third connection electrode block 0218 may be an irregular hexagon, and the shape of the fourth connection electrode block 0219 may also be an irregular hexagon. However, the present disclosure is not limited thereto, and the present disclosure does not specifically limit the shape of the third connection electrode block 0218 and the shape of the fourth connection electrode block 0219.

For example, the third connection electrode block 0218 may be a portion protruding outward from one side (for example, a side of a lower left side of the hexagon) of the third driving electrode block 0214 that has a hexagonal shape; and the fourth connection electrode block 0219 may be a portion protruding outward from one side (for example, a side of a lower right side of the hexagon) of the fourth driving electrode block 0215 that has a hexagonal shape.

For example, in some embodiments, as shown in FIGS. 9A and 9C, the third driving electrode block 0214 and the third connection electrode block 0218 are integrally provided, as shown in FIGS. 9A and 9D, the fourth driving electrode block 0215 and the fourth connection electrode block 0219 are also provided integrally. It should be noted that, in other examples, the third driving electrode block 0214 and the third connection electrode block 0218 may be separately provided, as long as the third driving electrode block 0214 and the third connection electrode block 0218 can be electrically connected to each other, similarly, the fourth driving electrode block 0215 and the fourth connection electrode block 0219 can be separately provided, as long as the fourth driving electrode block 0215 and the fourth connection electrode block 0219 can be electrically connected to each other.

For example, similar to the first sub-pixel of second color and the second sub-pixel of second color, as shown in FIG. 9C, in a direction perpendicular to the surface of the base substrate 00, the first electrode layer 021c of the light emitting element of the sub-pixel of first color is disposed on a side of the light emitting layer 022c of the light emitting element of the sub-pixel of first color close to the flat layer 024, and the second electrode layer 023c of the light emitting element of the sub-pixel of first color is disposed on a side of the light emitting layer 022c of the light emitting element of the sub-pixel of first color away from the flat layer 024; as shown in FIG. 9D, in the direction perpendicular to the surface of the base substrate 00, the first electrode layer 021d of the light emitting element of the sub-pixel of third color is disposed on the side of the light emitting layer 022d of the light emitting element of the sub-pixel of third color close to the flat layer 024, and the second electrode layer 023d of the light emitting element of the sub-pixel of third color is disposed on a side of the light emitting layer 022d of the light emitting element of the sub-pixel of third color away from the flat layer 024.

For example, as shown in FIG. 9C, the flat layer 024 further includes a third hole h3. The third connection electrode block 0218 extends to the third hole h3 and is electrically connected to the light emitting control circuit 101c of the pixel circuit of the sub-pixel of first color through the third hole h3. For example, the third connection electrode block 0218 may cover and fill the third hole h3.

For example, as shown in FIG. 9D, the flat layer 024 further includes a fourth hole h4. The fourth connection electrode block 0219 extends to the fourth hole h4 and is electrically connected to the light emitting control circuit 101d of the pixel circuit of the sub-pixel of third color through the fourth hole h4. For example, the fourth connection electrode block 0219 may cover and fill the fourth hole h4.

For example, the third connection electrode block 0218 extends to the source/drain metal layer of the pixel circuit through the third hole h3; the fourth connection electrode block 0219 extends to the source/drain metal layer of the pixel circuit through the fourth hole h4.

For example, as shown in FIG. 9A, in each repeating unit 100, in the first direction X, the third connection electrode 0218 is located on a side of the third driving electrode block 0214 away from the auxiliary electrode block 0212 of the first sub-pixel of second color, in the second direction Y, the third connection electrode 0218 is located on a side of the third driving electrode block 0214 close to the fourth driving electrode block 0215, that is, in the example shown in FIG. 9A, the third connection electrode block 0218 is located on the upper left side of the third driving electrode block 0214.

For example, as shown in FIG. 9A, in each repeating unit 100, in the first direction X, the fourth connection electrode 0219 is located on a side of the fourth driving electrode block 0215 away from the auxiliary electrode block 0212 of the first sub-pixel of second color, in the second direction Y, the fourth connection electrode 0219 is located on the side of the fourth driving electrode block 0215 close to the third driving electrode block 0214, that is, in the example shown in FIG. 9A, the fourth connection electrode block 0219 is located on the upper right side of the fourth driving electrode block 0215.

For example, as shown in FIG. 9C, the pixel defining layer 160 further includes a second opening, the second opening exposes a portion of the first electrode layer 021c of the light emitting element of the sub-pixel of first color, at least a portion of the light emitting layer 022c of the light emitting element of the sub-pixel of first color is located in the second opening and covers the exposed portion of the first electrode layer 021c, and the region where the second opening overlaps with the first electrode layer 021c is the effective light emitting region of the sub-pixel of first color. As shown in FIG. 9D, the pixel defining layer 160 further includes a third opening, and the third opening exposes a portion of the first electrode layer 021d of the light emitting element of the sub-pixel of third color, at least a portion of the light emitting layer 022d of the light emitting element of the sub-pixel of third color is located in the third opening and covers the exposed portion of the first electrode layer 021d, and the region where the third opening overlaps with the first electrode layer 021d is an effective light emitting region of the sub-pixel of third color.

Figure 9E:
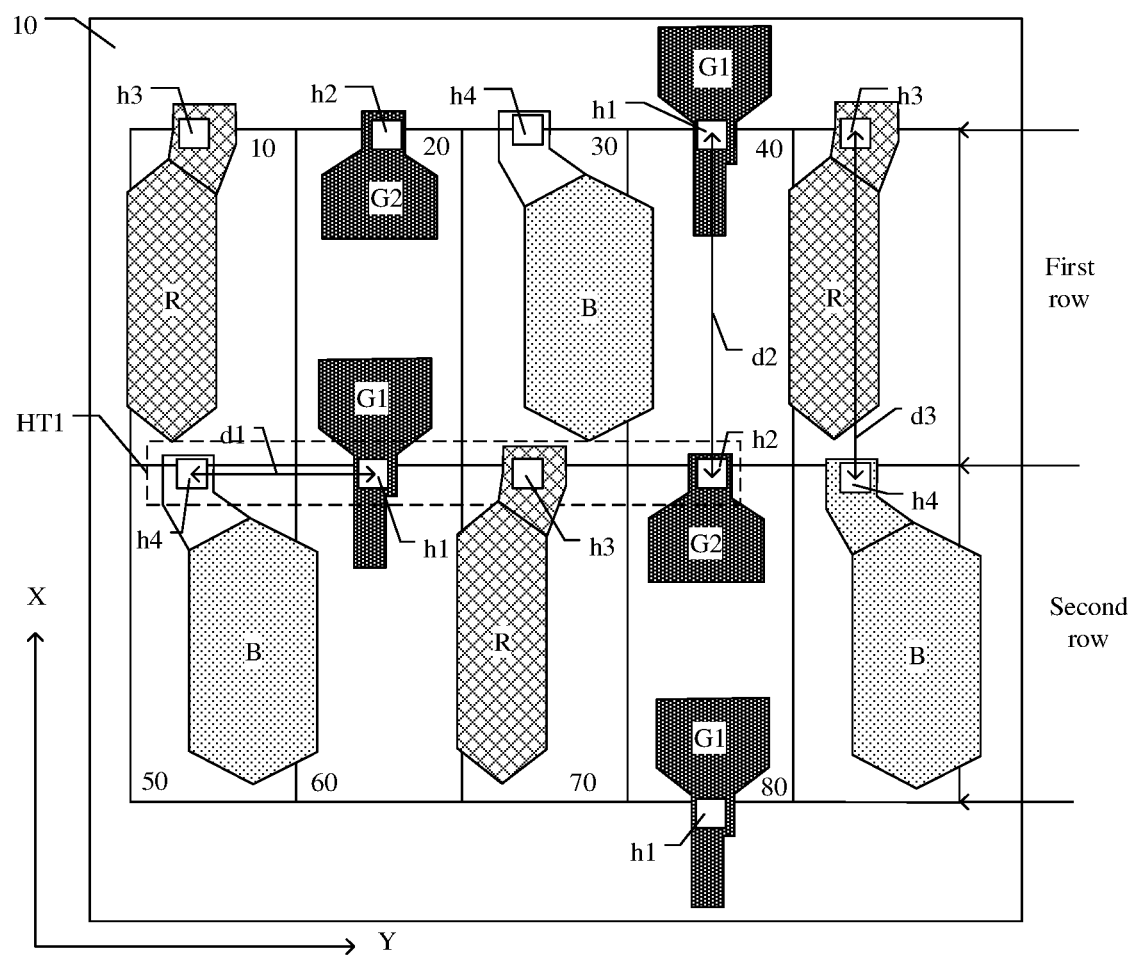
FIG. 9E is a schematic plane diagram of another display panel provided by some embodiments of the present disclosure.

FIG. 9E is a schematic plane diagram of another display panel provided by some embodiments of the present disclosure. It should be noted that FIG. 9E shows a driving electrode block of each sub-pixel, an auxiliary electrode block of each first sub-pixel of second color, and a connection electrode block of each sub-pixel, and FIG. 9E also shows holes corresponding to respective connection electrode blocks. It should be noted that the connection electrode block of each sub-pixel may cover and fill the corresponding hole, for example, the first connection electrode block covers and fills the first hole h1, the second connection electrode block covers and fills the second hole h2, the third connection electrode block covers and fills the third hole h3, and the fourth connection electrode block covers and fills the fourth hole h4. However, in order to show the position of each hole, in FIG. 9E, each hole is located above the corresponding connection electrode block.

For example, as shown in FIG. 9E, in the second direction Y, the holes are arranged in a plurality of rows, and respective holes in each row are arranged in an order of the first hole h1, the third hole h3, the second hole h2, and the fourth hole h4, that is, the first hole h1, the third hole h3, the second hole h2, and the fourth hole h4 are an arrangement period HT1, in the arrangement period HT1, the first hole h1 corresponds to the first sub-pixel of second color located in the first row and adjacent to the first hole h1, the second hole h2 corresponds to the second sub-pixel of second color located in the second row and adjacent to the second hole h2, the third hole h3 corresponds to the sub-pixel of first color located in the second row and adjacent to the third hole h3, and the fourth hole h4 corresponds to the sub-pixel of third color located in the second row and adjacent to the fourth hole h4.

For example, in the second direction Y, the respective holes in each row is located on the same straight line, that is, the first hole h1, the third hole h3, the second hole h2, and the fourth hole h4 in each arrangement period HT1 are located on the same straight line, and the respective arrangement periods HT1 are also located on the same straight line.

For example, in the second direction Y, a distance between any two adjacent holes is a first fixed distance d1, that is, as shown in FIG. 9E, in the arrangement period HT1, a distance between the first hole h1 and the fourth hole h4 is the first fixed distance d1, a distance between the first hole h1 and the third hole h3 is also the first fixed distance d1, a distance between the second hole h2 and the third hole h3 is also the first fixed distance d1, and a distance between the second hole h2 and the fourth hole h4 is also the first fixed distance d1. It should be noted that "two adjacent holes" indicates that there are no holes between the two adjacent holes, and the first fixed distance d1 may represent a distance between centers of two adjacent holes in the second direction Y.

For example, as shown in FIG. 9E, in the first direction X, the respective first holes h1 and the respective second holes h2 are arranged in a plurality of first hole columns, the respective third holes h3 and the respective fourth holes h4 are arranged in a plurality of second hole columns. In the second direction Y, the first hole column and the second hole column are alternately arranged, that is, the plurality of first hole columns may be odd columns, and the plurality of second hole columns may be even columns. In each first hole column, the respective first holes h1 and the respective second holes h2 are located on the same straight line, and in each second hole column, the respective third holes h3 and the respective fourth holes h4 are also located on the same straight line.

For example, in the first direction X, a distance between any first hole h1 and second hole h2 that is adjacent to the first hole h1 is a second fixed distance d2, a distance between any third hole h3 and fourth hole h4 that is adjacent to the third hole h3 is a third fixed distance d3, and the second fixed distance d2 and the third fixed distance d3 are equal. It should be noted that the second fixed distance d2 may represent a distance between a center of the first hole h1 and a center of the second hole h2 that is adjacent to the first hole h1 in the first direction X, and the third fixed distance d3 may represent a distance between a center of the third hole h3 and a center of the fourth via hole h4 that is adjacent to the third hole h3 in the first direction X.

For example, the plurality of repeating units 100 are arranged along the second direction Y to form a plurality of repeating unit groups, and the plurality of repeating unit groups are arranged along the first direction X. As shown in FIG. 9E, in the first direction X, the first connection electrode block, the second connection electrode block, the third connection electrode block, and the fourth connection electrode block are located between two adjacent repeating unit groups, in the first direction X, at least a part of the auxiliary electrode block of the first sub-pixel of second color is located on a side of the auxiliary electrode block away from the first driving electrode block and between two adjacent repeating units in the repeating unit group adjacent to the repeating unit group in which the auxiliary electrode block is located. For example, in some embodiments, a P-th repeating unit group is on the first row, and a (P+1)-th repeating unit group is on the second row. For the repeating units located in the P-th repeating unit group, at least a part of the auxiliary electrode block is located on the side of the auxiliary electrode block away from the first driving electrode block and between two adjacent repeating units in the repeating unit group (that is, the (P+1)-th repeating unit group in the second row) adjacent to the repeating unit group (that is, the P-th repeating unit group in the first row) in which the auxiliary electrode block is located. For example, as shown in FIG. 9E, at least a part of the auxiliary electrode block in the repeating unit in the first row extends to the second row and is located between two adjacent repeating units in the second row, for example, at least a part of the auxiliary electrode block in the repeating unit in the first row is located between the sub-pixel of first color and the sub-pixel of third color B that is adjacent to the sub-pixel of first color in the first row.

For example, in the present disclosure, the active layers of the respective transistors (for example, the driving transistor M1, the data writing transistor M2, the threshold compensation transistor M3, the reference voltage writing transistor M4, the light emitting control transistor M5, the first reset transistor M6, the second reset transistor M7, and the like) in the pixel circuit of each sub-pixel are located in the active semiconductor layer, the gate electrodes of the respective transistors in the pixel circuit are located in the gate metal layer, and the source electrodes and the drain electrodes of the respective transistors in the pixel circuit are located in the source/drain metal layer.

For example, as shown in FIG. 9B, the light emitting control transistor of the light emitting control circuit 101a of the first sub-pixel of second color includes a second electrode 1011a (for example, a drain electrode) and an active layer 1012a. The driving transistor of the driving circuit of the first sub-pixel of second color includes a gate electrode N1a and an active layer 1222a. It should be noted that FIG. 9B does not show the gate electrode and the first electrode of the light emitting control transistor of the first sub-pixel of second color, the first electrode and the second electrode of the driving transistor of the first sub-pixel of second color, and the like.

For example, a gate insulating layer 131 is provided between the gate electrode N1a and the active layer 1222a of the driving transistor of the first sub-pixel of second color, and the gate insulating layer 131 covers the entire display panel. Accordingly, the gate insulating layer 131 is also provided between the gate electrode and the active layer of the light emitting control transistor. The gate electrode N1a of the driving transistor of the first sub-pixel of second color is disposed on a side of the gate insulating layer 131 away from the base substrate 00.

For example, as shown in FIG. 9B, an interlayer insulating layer 132 is further provided on the gate electrode N1a of the driving transistor of the first sub-pixel of second color. The second electrode 1011*a* of the light emitting control transistor of the first sub-pixel of second color is disposed on the side of the interlayer insulating layer 132 away from the base substrate 00, and is electrically connected to the active layer 1012*a* of the light emitting control transistor through a hole penetrating the interlayer insulating layer 132 and the gate insulating layer 131. For example, the interlayer insulating layer 132 also covers the entire display panel.

For example, the second electrode 1011*a* of the light emitting control transistor of the first sub-pixel of second color is located in the source/drain metal layer of the pixel circuit, the gate electrode N1*a* of the driving transistor of the first sub-pixel of second color is located in the gate metal layer of the pixel circuit, and the active layer 1012*a* of the light emitting control transistor and the active layer 1222*a* of the driving transistor of the first sub-pixel of second color are located in the active semiconductor layer of the pixel circuit.

For example, the first connection electrode block 0216 extends to the source/drain metal layer of the pixel circuit through the first hole h1 to electrically connect to the second electrode 1011*a* of the light emitting control transistor of the first sub-pixel of second color in the source/drain metal layer of the pixel circuit.

For example, as shown in FIG. 9B, the light emitting control transistor of the light emitting control circuit 101*b* of the second sub-pixel of second color includes a second electrode 1011*b* (for example, a drain electrode) and an active layer 1012*b*. The driving transistor of the driving circuit of the second sub-pixel of second color includes a gate electrode N1*b* and an active layer 1222*b*. It should be noted that FIG. 9B does not show the gate electrode and the first electrode of the light emitting control transistor of the second sub-pixel of second color, the first electrode and the second electrode of the driving transistor of the second sub-pixel of second color, and the like.

For example, the gate insulating layer 131 is also provided between the gate electrode N1*b* and the active layer 1222*b* of the driving transistor of the second sub-pixel of second color. The second electrode 1011*b* of the light emitting control transistor of the second sub-pixel of second color is disposed on the side of the interlayer insulating layer 132 away from the base substrate 00, and is electrically connected to the active layer 1012*b* of the light emitting control transistor of the second sub-pixel of second color through a hole penetrating the interlayer insulating layer 132 and the gate insulating layer 131.

For example, the second electrode 1011*b* of the light emitting control transistor of the second sub-pixel of second color is located in the source/drain metal layer of the pixel circuit, the gate electrode N1*b* of the driving transistor of the second sub-pixel of second color is located in the gate metal layer of the pixel circuit, and the active layer 1012*b* of the light emitting control transistor and the active layer 1222*b* of the driving transistor in the second sub-pixel of second color are located in the active semiconductor layer of the pixel circuit.

For example, the second connection electrode block 0217 extends to the source/drain metal layer of the pixel circuit through the second hole h2, so as to electrically connect to the second electrode 1011*b* of the light emitting control transistor of the second sub-pixel of second color located on the source/drain metal layer of the pixel circuit.

For example, as shown in FIG. 9C, the light emitting control transistor of the light emitting control circuit 101*c* of the sub-pixel of first color includes a second electrode 1011*c* (for example, a drain electrode) and an active layer 1012*c*. The driving transistor of the driving circuit of the sub-pixel of first color includes a gate electrode N1*c* and an active layer 1222*c*. It should be noted that FIG. 9C does not show the gate electrode and the first electrode of the light emitting control transistor of the sub-pixel of first color, the first electrode and the second electrode of the driving transistor of the sub-pixel of first color, and the like.

For example, the gate insulating layer 131 is provided between the gate electrode N1*c* and the active layer 1222*c* of the driving transistor of the sub-pixel of first color, the second electrode 1011*c* of the light emitting control transistor of the sub-pixel of first color is disposed on the side of the interlayer insulating layer 132 away from the base substrate 00, and is electrically connected to the active layer 1012*c* of the light emitting control transistor of the sub-pixel of first color through a hole penetrating the interlayer insulating layer 132 and the gate insulating layer 131.

For example, the second electrode 1011*c* of the light emitting control transistor of the sub-pixel of first color is located in the source/drain metal layer of the pixel circuit, the gate electrode N1*c* of the driving transistor of the sub-pixel of first color is located in the gate metal layer of the pixel circuit, and the active layer 1012*c* of the light emitting control transistor and the active layer 1222*c* of the driving transistor in the sub-pixel of first color are located in the active semiconductor layer of the pixel circuit.

For example, the third connection electrode block 0218 extends to the source/drain metal layer of the pixel circuit through the third hole h3, so as to electrically connect to the second electrode 1011*c* of the light emitting control transistor of the sub-pixel of first color located in the source/drain metal layer of the pixel circuit.

For example, as shown in FIG. 9D, the light emitting control transistor of the light emitting control circuit 101*d* of the sub-pixel of third color includes a second electrode 1011*d* (for example, a drain electrode) and an active layer 1012*d*. The driving transistor of the driving circuit of the sub-pixel of first color includes a gate electrode N1*d* and an active layer 1222*d*. It should be noted that FIG. 9D does not show the gate electrode and the first electrode of the light emitting control transistor of the sub-pixel of third color, the first electrode and the second electrode of the driving transistor of the sub-pixel of third color, and the like.

For example, the gate insulating layer 131 is provided between the gate electrode N1*d* and the active layer 1222*d* of the driving transistor of the sub-pixel of third color, the second electrode 1011*d* of the light emitting control transistor of the sub-pixel of third color is disposed on the side of the interlayer insulating layer 132 away from the base substrate 00, and is electrically connected to the active layer 1012*d* of the light emitting control transistor of the sub-pixel of third color through a hole penetrating the interlayer insulating layer 132 and the gate insulating layer 131.

For example, the second electrode 1011*d* of the light emitting control transistor of the sub-pixel of third color is located in the source/drain metal layer of the pixel circuit, the gate electrode N1*d* of the driving transistor of the sub-pixel of third color is located in the gate metal layer of the pixel circuit of the sub-pixel of third color, and the active layer 1012*d* of the light emitting control transistor and the active layer 1222*d* of the driving transistor of the sub-pixel of third color are located in the active semiconductor layer of the pixel circuit.

It should be noted that the active layer of each transistor may include a source region, a drain region, and a channel region between the source region and the drain region. For example, the active layers of the respective transistors are provided integrally.

For example, the fourth connection electrode block 0219 extends to the source/drain metal layer of the pixel circuit through the fourth hole h4, so as to electrically connect to the second electrode 1011d of the light emitting control transistor of the sub-pixel of third color located in the source/drain metal layer of the pixel circuit.

It should be noted that FIG. 9B to FIG. 9D are only schematic drawings and only show a part of the layer structure of the pixel circuit of the sub-pixel. Each layer may also include other elements, or other intermediate layers may be included between the layers. The present disclosure are not specifically limited thereto.

For example, as shown in FIG. 3, for the pixel circuit of each sub-pixel, the first gate signal terminal GA1 is connected to a first gate signal line, the second gate signal terminal GA2 is connected to a second gate signal line. In some embodiments, the first gate signal line and the second gate signal line may be the same signal line. The reference control signal terminal EM2 is connected to a reference control signal line, and the light emitting control signal terminal EM1 is connected to a light emitting control signal line. In some embodiments, the reference control signal line and the light emitting control signal line may be the same signal line. For example, the first reset signal terminal RST1 is connected to a first reset signal line, and the second reset signal terminal RST2 is connected to a second reset signal line. In some embodiments, the first reset signal line and the second reset signal line may be the same signal line. The initialization signal terminal Vint may be connected to an initialization signal line, and the reference voltage signal terminal Vref may be connected to a reference voltage signal line.

For example, on the base substrate 00, the first gate signal line, the second gate signal line, the reference control signal line, the light emitting control signal line, the first reset signal line, the second reset signal line, the initialization signal line, and the reference voltage signal line are arranged along the first direction X and all extend along the second direction Y.

For example, the first gate signal line, the second gate signal line, the reference control signal line, the light emitting control signal line, the first reset signal line, the second reset signal line, the initialization signal line, and the reference voltage signal line are substantially parallel.

For example, the first DC power terminal VDD is connected to the first power line, the data signal terminal DA is connected to the data line, and the first power line and the data line are substantially parallel to each other.

For example, the first power line and the data line are arranged along the second direction Y, and both extend along the first direction X.

It should be noted that in the present disclosure, "extend" represents a routing direction of each signal line (e.g., the first gate signal line, the second gate signal line, the reference control signal line, the light emitting control signal line, the first reset signal line, the second reset signal line, the initialization signal line, and the reference voltage signal line) in general. Each signal line may not be a straight line in microscopic view, but may extend along the second direction Y in a wavy shape.

For example, in the first direction X, the gate electrode of the driving transistor of the pixel circuit of each sub-pixel is located between the first gate signal line/second gate signal line connected to the pixel circuit and the light emitting control signal line/reference control signal connected to the pixel circuit.

For example, in the first direction X, for each repeating unit, the first gate signal line/second gate signal line is disposed between the first electrode layer of the first sub-pixel of second color and the first electrode layer of the second sub-pixel of second color.

Figure 10:
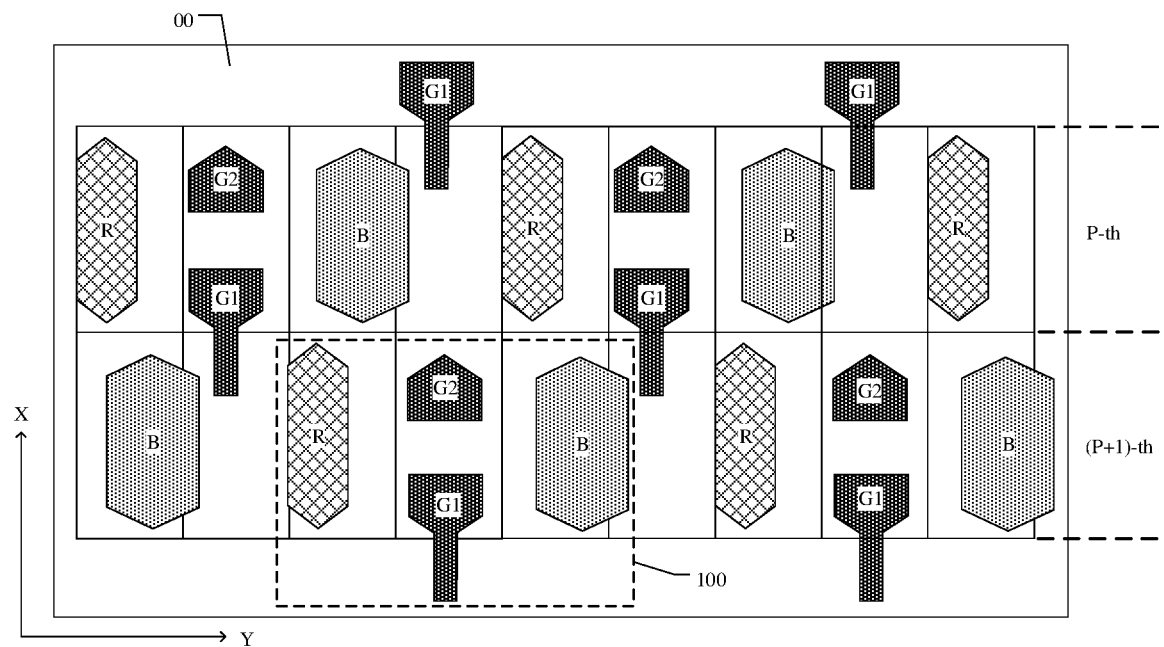
FIG. 10 is a schematic structural diagram of a display panel provided by some other embodiments of the present disclosure.

FIG. 10 is a schematic structural diagram of a display panel provided by some other embodiments of the present disclosure.

For example, FIG. 5 only shows one complete repeating unit 100, but the present disclosure is not limited thereto. A plurality of sub-pixels constitute a plurality of repeating units 100, and the plurality of repeating units 100 are arranged in an array on the base substrate 00. For example, as shown in FIG. 10, the plurality of repeating units 100 are arranged along the second direction Y to form a plurality of repeating unit groups. FIG. 10 shows two repeating unit groups, the two repeating unit groups are the P-th repeating unit group and the (P+1)-th repeating unit group, respectively, and the P-th repeating unit group and the (P+1)-th repeating unit group are two adjacent repeating unit groups, for example, P is a positive integer greater than or equal to 1. The plurality of repeating unit groups are arranged along the first direction X. That is, the plurality of repeating units 100 are arranged in an array along the first direction X and the second direction Y. It should be noted that referring to FIG. 9E above, the P-th repeating unit group is located in the first row, the (P+1)-th repeating unit group is located in the second row, and the connection electrode blocks of the light emitting elements of the respective sub-pixels are not shown in FIG. 10.

For example, an extension line of a connection line between a center of the first sub-pixel of second color and a center of the second sub-pixel of second color of a repeating unit in the P-th repeating unit group does not coincide with an extension line of a connection line between a center of the first sub-pixel of second color and a center of the second sub-pixel of second color of a repeating unit in the (P+1)-th repeating unit group. For example, the extension line of the connection line between the center of the first sub-pixel of second color and the center of the second sub-pixel of second color of the repeating unit in the P-th repeating unit group passes through a center of the interval between two adjacent repeating units in the (P+1)-th repeating unit group, similarly, the extension line of the connection line between the center of the first sub-pixel of second color and the center of the second sub-pixel of second color of the repeating unit in the (P+1)-th repeating unit group passes through a center of the interval between two adjacent repeating units in the P-th repeating unit group.

For example, the display panel provided by the embodiment of the present disclosure may be a liquid crystal display panel, an organic light emitting diode (OLED) display panel, or the like.

For example, the display panel may be a rectangular panel, a circular panel, an elliptical panel, a polygonal panel, or the like. In addition, the display panel may be not only a planar panel, but also a curved panel or even a spherical panel.

For example, the display panel may also have a touch function, that is, the display panel may be a touch display panel.

For example, the display panel can be applied to any product or component with a display function, such as a mobile phone, a tablet computer, a television, a display, a notebook computer, a digital photo frame, a navigator, etc.

In summary, the embodiment of the present disclosure provides a display panel. A plurality of sub-pixels of different colors included in the display panel are arranged in an order of a sub-pixel of first color, a sub-pixel of second color, a sub-pixel of third color, and a sub-pixel of second color. Because the orthographic projection of the first electrode layer in each sub-pixel of second color in the display panel on the base substrate overlaps with the orthographic projection of the gate electrode of the driving transistor in the sub-pixel of second color on the base substrate, and therefore, a difference between the capacitance of the parasitic capacitor between the first electrode layer of the light emitting element in the first sub-pixel of second color of the two sub-pixels of second color and the gate electrode of the driving transistor in the first sub-pixel of second color and the capacitance of the parasitic capacitor between the first electrode layer in the second sub-pixel of second color of the two sub-pixels of second color and the gate electrode of the driving transistor in the second sub-pixel of second color is small, and furthermore, the brightness difference among the light emitting elements of the respective sub-pixels of second color can be small or there is no brightness difference, the brightness uniformity of the display panel is good, and the display effect of the display device is good.

Figure 11:
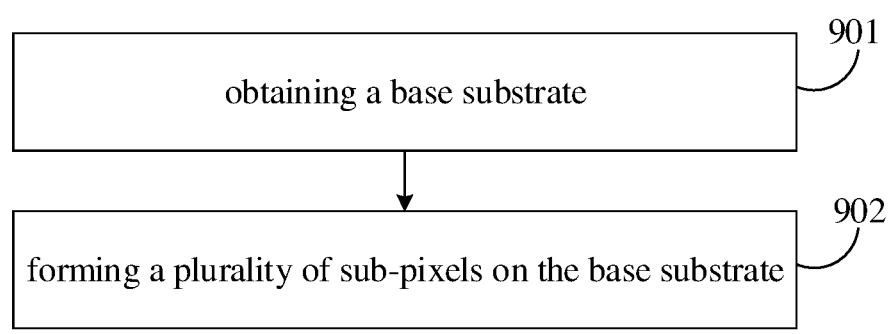
FIG. 11 is a flowchart of a manufacturing method for manufacturing a display panel according to some embodiments of the present disclosure.

FIG. 11 is a flowchart of a manufacturing method for manufacturing a display panel according to some embodiments of the present disclosure. The manufacturing method can be used to manufacture the display panel described in any of the above embodiments, for example, the manufacturing method can be used to manufacture the display panel shown in FIG. 2 or FIG. 5 or FIG. 9A.

For example, as shown in FIG. 11, the manufacturing method may include:

Step 901: obtaining a base substrate.

Step 902: forming a plurality of sub-pixels on the base substrate.

In the embodiment of the present disclosure, as shown in FIG. 2, the plurality of sub-pixels of different colors may be arranged in the order of the sub-pixel of first color C1, the sub-pixel of second color C2, the sub-pixel of third color C3, and the sub-pixel of second color C2.

For example, as shown in FIG. 5, the plurality of sub-pixels constitute a plurality of repeating units 100, and each repeating unit 100 includes a sub-pixel of first color C1, two sub-pixels of second color C2, and a sub-pixel of third color C3.

For example, each sub-pixel may include a driving transistor and a light emitting element connected to the driving transistor, and referring to FIG. 4, the light emitting element may include a first electrode layer 021, a light emitting layer 022, and a second electrode layer 023. An orthographic projection of the first electrode layer in each sub-pixel of second color on the base substrate at least partially overlaps with an orthographic projection of a gate electrode of the driving transistor in each sub-pixel of second color on the base substrate.

In summary, the embodiment of the present disclosure provides a manufacturing method for manufacturing a display panel, the manufacturing method can form the plurality of sub-pixels of different colors on the base substrate, and the plurality of sub-pixels of different colors may be arranged in an order of a sub-pixel of first color, a sub-pixel of second color, a sub-pixel of third color, and a sub-pixel of second color. Because the orthographic projection of the first electrode layer in each sub-pixel of second color in the display panel on the base substrate overlaps with the orthographic projection of the gate electrode of the driving transistor in the sub-pixel of second color on the base substrate, and therefore, a difference between the capacitance of the parasitic capacitor between the first electrode layer of the light emitting element in the first sub-pixel of second color of the two sub-pixels of second color and the gate electrode of the driving transistor in the first sub-pixel of second color and the capacitance of the parasitic capacitor between the first electrode layer in the second sub-pixel of second color of the two sub-pixels of second color and the gate electrode of the driving transistor in the second sub-pixel of second color is small, and furthermore, the brightness difference among the light emitting elements of the respective sub-pixels of second color can be small or there is no brightness difference, the brightness uniformity of the display panel is good, and the display effect of the display device is good.

For example, in some embodiments of the present disclosure, a driving transistor may be formed on the base substrate 00 first, then a flat layer 024 is formed on a side of the driving transistor away from the base substrate 00, then a first electrode layer 021 is formed on a side of the flat layer 024 away from the driving transistor through one patterning process, and an orthographic projection of the first electrode layer 021 on the base substrate 00 at least partially overlaps with an orthographic projection of a gate electrode N1 of the driving transistor on the base substrate 00. After that, a light emitting layer 022 can be formed on a side of the first electrode layer 021 away from the flat layer 024 by a method of multiple evaporation, and then a second electrode layer 023 can be formed on a side of the light emitting layer 022 away from the first electrode layer 021. The one patterning process may include: photolithographic coating, exposure, development, etching, and photoresist stripping. The embodiments of the present disclosure do not limit the specific method of the patterning process.

For example, as shown in FIG. 8A, taking the first sub-pixel of second color as an example, a driving transistor may be formed on the base substrate 00 first (FIG. 8A shows only a gate electrode N1a of the driving transistor). And then, a flat layer 024 may be formed on a side of the driving transistor away from the base substrate 00, and a first electrode layer 021a may be formed on a side of the flat layer 024 away from the gate electrode N1a of the driving transistor. Next, a light emitting layer 022a is formed on a side of the first electrode layer 021a away from the flat layer 024, and a second electrode layer 023a is formed on a side of the light emitting layer 022a away from the first electrode layer 021a. Furthermore, referring to FIG. 8A, it can also be seen that the first electrode layer 021a may include a first driving electrode block 0211 and an auxiliary electrode block 0212 connected to the first driving electrode block 0211, an orthographic projection of the auxiliary electrode block 0212 on the base substrate 00 at least partially overlaps with an orthographic projection of the gate electrode N1a of the driving transistor on the base substrate 00, and an overlap region between the orthographic projection of the auxiliary electrode block 0212 on the base substrate 00 and the orthographic projection of the gate electrode N1a of the driving transistor on the base substrate 00 is A1. For example, the first driving electrode block 0211 and the auxiliary electrode block 0212 may also be separately formed through two patterning processes, which is not limited in the embodiment of the present disclosure.

For example, as shown in FIG. 9B, the first electrode layer 021a may further include a first connection electrode block 0216. In a case where the flat layer 024 is formed, a first hole h1 can also be formed in the flat layer 024, and the first connection electrode block 0216 is electrically connected to the light emitting control circuit 101a of the pixel circuit of the first sub-pixel of second color through the first hole h1.

It is worth noting that for detailed descriptions of the display panel, reference may be made to the related descriptions in the above-mentioned embodiments of the display panel, and similar portions are not repeated here.

Figure 12A:
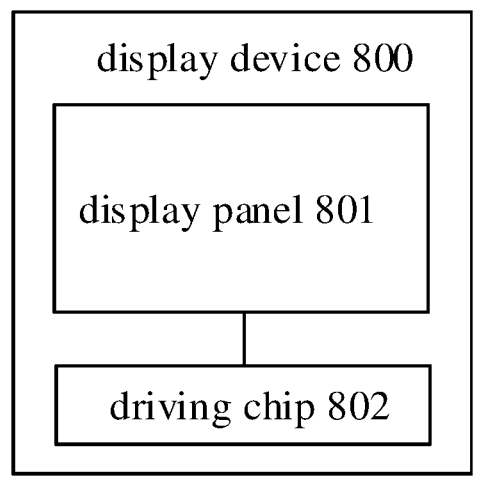
FIG. 12A is a schematic block diagram of a display device provided by some embodiments of the present disclosure.

In addition, an embodiment of the present disclosure also provides a display device. FIG. 12A is a schematic block diagram of a display device provided by some embodiments of the present disclosure; and FIG. 12B is a schematic structural diagram of a display device provided by some embodiments of the present disclosure.

For example, as shown in FIG. 12A, the display device 800 may include a display panel 801, and the display panel 801 may be a display panel provided by any one of the foregoing embodiments.

For example, as shown in FIG. 12A, the display device 800 may further include a driving chip 802, and the driving chip 802 is electrically connected to the display panel 801.

Figure 12B:
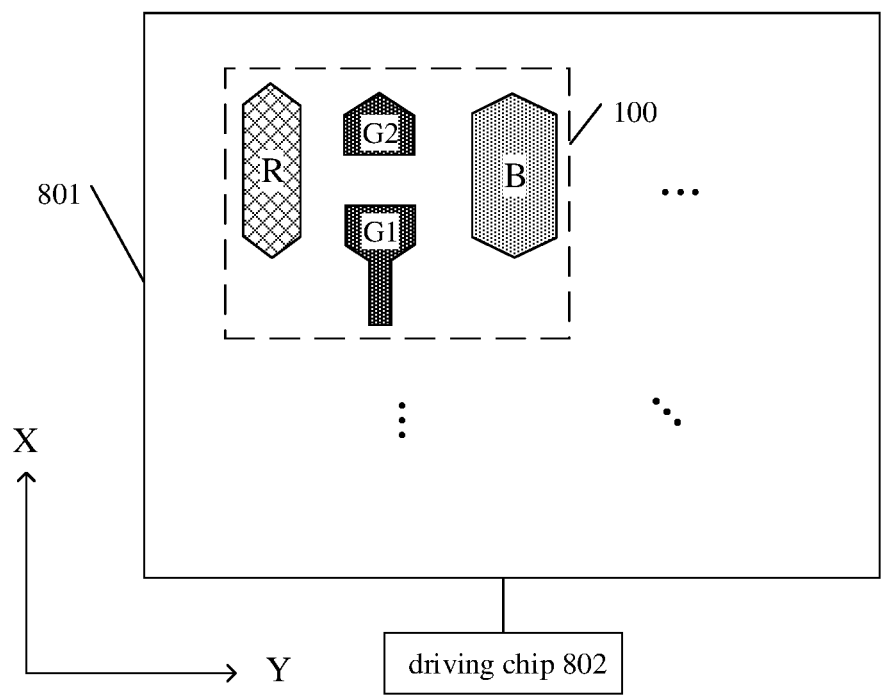
FIG. 12B is a schematic structural diagram of a display device provided by some embodiments of the present disclosure.

For example, as shown in FIG. 12B, the first sub-pixel of second color and the second sub-pixel of second color in each repeating unit 100 on the display panel 801 are arranged along the first direction X, and in the first direction X, the driving chip 802 is located on a side of the first sub-pixel of second color away from the second sub-pixel of second color in each repeating unit 100. For example, as shown in FIG. 12B, the anode G1 of the light emitting element of the first sub-pixel of second color and the anode G2 of the light emitting element of the second sub-pixel of second color are arranged along the first direction X. and the driving chip 802 is located on a side of the anode G1 of the light emitting element of the first sub-pixel of second color away from the anode G2 of the light emitting element of the second sub-pixel of second color in each repeating unit 100. That is, in the first direction X, a distance between the anode G1 of the light emitting element of the first sub-pixel of second color and the driving chip 802 is smaller than a distance between the anode G2 of the light emitting element of the second sub-pixel of second color and the driving chip 802. For example, in the example shown in FIG. 12B, relative to the anode G2 of the light emitting element of the second sub-pixel of second color, the anode G1 of the light emitting element of the first sub-pixel of second color is closer to a lower side of the display panel 801, so that the driving chip 802 can be located on the lower side of the display panel 801.

For example, the driving chip 802 may be a semiconductor chip, and may include a data driver. The driving chip 802 is used to drive a plurality of data lines in the display panel 801. For example, the data driver may provide data signals to the plurality of data lines.

The display device 800 can be any product or component with a display function, such as a LTPO (Low Temperature Polycrystalline Oxide) display panel, an electronic paper, an OLED panel, an AMOLED panel, a mobile phone, a tablet computer, a television, a monitor, a notebook computer, a digital photo frame, or the like.

It should be noted that other components of the display device 800 (e.g., a control device, an image data encoding/decoding device, a gate driver, a clock circuit, etc.) should be understood by those of ordinary skill in the art, and are not described in detail herein, nor should they be taken as limitations on the present disclose.

The above descriptions are only optional embodiments of the present disclosure and are not intended to limit the present disclosure. Any modification, equivalent replacement, or improvement made within the spirit and principle of the present disclosure shall be included in the protection scope of the present disclosure.

For the present disclosure, the following points need to be explained:

(1) The drawings of the embodiments of the present disclosure only refer to the structures related to the embodiments of the present disclosure, and other structures may refer to the general design.

(2) For the sake of clarity, in the drawings used to describe embodiments of the present disclosure, the thicknesses and sizes of the layers or structures are exaggerated. It will be understood that in a case where an element, such as a layer, a film, a region, or a substrate, is referred to as being "on" or "under" another element, the element may be "directly" "on" or "under" the other element, or there may be an intermediate element between the element and the another element.

(3) In case of no conflict, the embodiments of the present disclosure and the features in the embodiments can be combined with each other to obtain new embodiments.

What have been described above merely are specific implementations of the present disclosure, but the protection scope of the present disclosure is not limited to this, and the protection scope of the present disclosure is determined by the appended claims.

What is claimed is:

1. A display panel, comprising: a base substrate and a plurality of sub-pixels disposed on the base substrate, wherein the plurality of sub-pixels constitute a plurality of repeating units, each of the plurality of repeating units comprises a sub-pixel of first color, two sub-pixels of second color, and a sub-pixel of third color;

each of the plurality of sub-pixels comprises a driving transistor and a light emitting element electrically connected to the driving transistor, and the light emitting element comprises a first electrode layer, a light emitting layer, and a second electrode layer;

an orthographic projection of the first electrode layer of the light emitting element in each sub-pixel of second color on the base substrate at least partially overlaps with an orthographic projection of a gate electrode of the driving transistor in each sub-pixel of second color on the base substrate, wherein each of the plurality of sub-pixels comprises a pixel circuit, and the pixel circuit comprises the driving transistor, the orthographic projection of the first electrode layer of the light emitting element in a first one of the two sub-pixels of second color on the base substrate at least partially overlaps with an orthographic projection of the pixel circuit in a second one of the two sub-pixels of second color on the base substrate;

the orthographic projection of the first electrode layer of the light emitting element in the second sub-pixel of second color on the base substrate does not overlap with the orthographic projection of the pixel circuit in the first sub-pixel of second color on the base substrate.

2. The display panel according to claim 1, wherein the orthographic projection of the gate electrode of the driving transistor in each sub-pixel of second color on the base substrate is within the orthographic projection of the first electrode layer of the light emitting element in each sub-pixel of second color on the base substrate.

3. The display panel according to claim 1, wherein a shape of the first electrode layer of the light emitting element in the first sub-pixel of second color is different from a shape of the first electrode layer of the light emitting element in the second sub-pixel of second color.

4. The display panel according to claim 3, wherein the first electrode layer of the light emitting element in the first sub-pixel of second color comprises: a first driving electrode block and an auxiliary electrode block connected to the first driving electrode block;
   an orthographic projection of the first driving electrode block on the base substrate does not overlap with the orthographic projection of the gate electrode of the driving transistor in the first sub-pixel of second color on the base substrate; and
   an orthographic projection of the auxiliary electrode block on the base substrate at least partially overlaps with the orthographic projection of the gate electrode of the driving transistor in the first sub-pixel of second color on the base substrate.

5. The display panel according to claim 4, wherein a ratio of an area of a first projection overlap region of the auxiliary electrode block to an area of a second projection overlap region of the first electrode layer of the light emitting element in the second sub-pixel of second color is within a ratio range;
   the first projection overlap region is an overlap region between the orthographic projection of the auxiliary electrode block on the base substrate and the orthographic projection of the gate electrode of the driving transistor in the first sub-pixel of second color on the base substrate, the second projection overlap region is an overlap region between the orthographic projection of the first electrode layer of the light emitting element in the second sub-pixel of second color on the base substrate and the orthographic projection of the gate electrode of the driving transistor in the second sub-pixel of second color on the base substrate, and the ratio range is from 90 percent to 110 percent.

6. The display panel according to claim 4, wherein the first electrode layer of the light emitting element in the second sub-pixel of second color comprises a second driving electrode block;
   an orthographic projection of the second driving electrode block on the base substrate at least partially overlaps with the orthographic projection of the gate electrode of the driving transistor in the second sub-pixel of second color on the base substrate.

7. The display panel according to claim 6, wherein a shape of the first driving electrode block is different from a shape of the auxiliary electrode block, the shape of the first driving electrode block is identical with a shape of the second driving electrode block, and an area of the orthographic projection of the first driving electrode block on the base substrate is identical with an area of the orthographic projection of the second driving electrode block on the base substrate.

8. The display panel according to claim 6, wherein a distance between a center of the gate electrode of the driving transistor of the pixel circuit of the first sub-pixel of second color and a center of the first driving electrode block is greater than a distance between a center of the gate electrode of the driving transistor of the pixel circuit of the second sub-pixel of second color and a center of the second driving electrode block.

9. The display panel according to claim 6, wherein the gate electrode of the driving transistor of the pixel circuit of the first sub-pixel of second color and the gate electrode of the driving transistor of the pixel circuit of the second sub-pixel of second color are arranged in a first direction, and the first direction is parallel to a surface of the base substrate,
   in the first direction, the first driving electrode block is on a side of the gate electrode of the driving transistor of the pixel circuit of the first sub-pixel of second color close to the gate electrode of the driving transistor of the pixel circuit of the second sub-pixel of second color.

10. The display panel according to claim 9, wherein in each repeating unit, the first sub-pixel of second color and the second sub-pixel of second color are arranged along the first direction, and in the first direction, the auxiliary electrode block is on a side of the first driving electrode block away from the light emitting element of the second sub-pixel of second color,
    in each repeating unit, the sub-pixel of first color and the sub-pixel of third color are arranged along a second direction, and in the second direction, the first sub-pixel of second color and the second sub-pixel of second color are between the sub-pixel of first color and the sub-pixel of third color,
    the second direction is parallel to the surface of the base substrate, and the first direction and the second direction are perpendicular to each other.

11. The display panel according to claim 10, further comprising: a flat layer on a side of the pixel circuit away from the base substrate;
    wherein the first electrode layer is on a side of the flat layer away from the driving transistor;
    the light emitting layer is on a side of the first electrode layer away from the flat layer; and
    the second electrode layer is on a side of the light emitting layer away from the first electrode layer,
    the first electrode layer of the light emitting element in the first sub-pixel of second color further comprises a first connection electrode block, and the first connection electrode block is electrically connected to the first driving electrode block, in the first direction, the first connection electrode block is on a side of the first driving electrode block away from the light emitting element of the second sub-pixel of second color,
    the first electrode layer of the light emitting element in the second sub-pixel of second color further comprises a second connection electrode block, and the second connection electrode block is electrically connected to the second driving electrode block, in the first direction, the second connection electrode block is on a side of the second driving electrode block away from the light emitting element of the first sub-pixel of second color,
    the flat layer comprises a first hole and a second hole,
    the first connection electrode block is electrically connected to the pixel circuit of the first sub-pixel of second color through the first hole, and the second connection electrode block is electrically connected to the pixel circuit of the second sub-pixel of second color through the second hole.

12. The display panel according to claim 11, wherein in the first direction, the first connection electrode block is between the gate electrode of the driving transistor of the pixel circuit of the first sub-pixel of second color and the gate electrode of the driving transistor of the pixel circuit of the second sub-pixel of second color,
    wherein in the first direction, the first connection electrode block is between the first driving electrode block and the auxiliary electrode block.

13. The display panel according to claim 11, wherein a shape of the first connection electrode block is identical with a shape of the second connection electrode block, an area of an orthographic projection of the first connection electrode block on the base substrate is identical with an area of an orthographic projection of the second connection electrode block on the base substrate.

14. The display panel according to claim 11, wherein the first electrode layer of the light emitting element of the sub-pixel of first color comprises a third driving electrode block and a third connection electrode block that are electrically connected to each other, and the first electrode layer of the light emitting element of the sub-pixel of third color comprises a fourth driving electrode block and a fourth connection electrode block that are electrically connected to each other, the flat layer comprises a third hole and a fourth hole, and the third connection electrode block extends to the third hole and is electrically connected to the pixel circuit of the sub-pixel of first color through the third hole, and the fourth connection electrode block extends to the fourth hole and is electrically connected to the pixel circuit of the sub-pixel of third color through the fourth hole, in each repeating unit, in the first direction, the third connection electrode block is on a side of the third driving electrode block away from the auxiliary electrode block, and in the second direction, the third connection electrode block is on a side of the third driving electrode block close to the fourth driving electrode block; in the first direction, the fourth connection electrode block is on a side of the fourth driving electrode block away from the auxiliary electrode block, and in the second direction, the fourth connection electrode block is on a side of the fourth driving electrode block close to the third driving electrode block.

15. The display panel according to claim 14, wherein the pixel circuit comprises an active semiconductor layer, a gate metal layer, and a source-drain metal layer, in a direction perpendicular to the base substrate, the active semiconductor layer is between the base substrate and the gate metal layer, and the gate metal layer is between the active semiconductor layer and the source-drain metal layer, the first connection electrode block extends to the source-drain metal layer through the first hole, the second connection electrode block extends to the source-drain metal layer through the second hole, the third connection electrode block extends to the source-drain metal layer through the third hole, and the fourth connection electrode block extends to the source-drain metal layer through the fourth hole.

16. The display panel according to claim 14, wherein the plurality of repeating units are arranged along a second direction to form a plurality of repeating unit groups, the plurality of repeating unit groups are arranged along the first direction, in the first direction, the first connection electrode block, the second connection electrode block, the third connection electrode block, and the fourth connection electrode block are between two adjacent repeating unit groups, and in the first direction, at least a part of the auxiliary electrode block away from the first driving electrode block is between two adjacent repeating units in a repeating unit group adjacent to a repeating unit group where the auxiliary electrode block is located.

17. The display panel according to claim 6, wherein the pixel circuit further comprises a parasitic sub-circuit, the parasitic sub-circuit of the pixel circuit in the first sub-pixel of second color comprises a first capacitor, and the first capacitor comprises a first electrode and a second electrode, the auxiliary electrode block serves as the first electrode of the first capacitor, and the gate electrode of the driving transistor of the first sub-pixel of second color is multiplexed as the second electrode of the first capacitor, the parasitic sub-circuit of the pixel circuit in the second sub-pixel of second color comprises a second capacitor, and the second capacitor comprises a first electrode and a second electrode, the second driving electrode block serves as the first electrode of the second capacitor, and the gate electrode of the driving transistor of the second sub-pixel of second color is multiplexed as the second electrode of the second capacitor.

18. The display panel according to claim 1, wherein the sub-pixel of first color is a red sub-pixel, the two sub-pixels of second color are both green sub-pixels, and the sub-pixel of third color is a blue sub-pixel.

19. A display device, comprising: the display panel according to claim 1.

* * * * *